United States Patent [19]
Tanzawa et al.

[11] Patent Number: 5,969,988
[45] Date of Patent: Oct. 19, 1999

[54] VOLTAGE MULTIPLIER CIRCUIT AND NONVOLATILE SEMICONDUCTOR MEMORY DEVICE HAVING VOLTAGE MULTIPLIER

[75] Inventors: Toru Tanzawa, Ebina; Tomoharu Tanaka, Yokohama; Hiroshi Nakamura, Kawasaki; Yoshiyuki Tanaka, Yokohama, all of Japan

[73] Assignee: Kabushiki Kaisha Toshiba, Kawasaki, Japan

[21] Appl. No.: 08/598,071

[22] Filed: Feb. 7, 1996

Related U.S. Application Data

[63] Continuation of application No. 08/291,692, Aug. 16, 1994, abandoned.

[30] Foreign Application Priority Data

Aug. 17, 1993 [JP] Japan ..................................... 5-203351
Dec. 28, 1993 [JP] Japan ..................................... 5-354151

[51] Int. Cl.[6] .................................................. G11C 16/06
[52] U.S. Cl. ............................... 365/185.23; 365/185.17; 365/185.18; 365/189.09
[58] Field of Search .............................. 365/226, 189.09, 365/185.23, 185.17, 185.18; 327/536, 538, 540

[56] References Cited

U.S. PATENT DOCUMENTS

| 4,311,923 | 1/1982 | Luscher et al. ......................... 307/297 |
| 4,633,106 | 12/1986 | Backes et al. ........................... 307/270 |
| 4,959,812 | 9/1990 | Momodomi et al. .................... 365/104 |
| 5,072,134 | 12/1991 | Min ...................................... 307/296.2 |
| 5,157,280 | 10/1992 | Schreck et al. ..................... 365/189.09 |
| 5,394,372 | 2/1995 | Tanaka et al. ........................... 365/226 |

FOREIGN PATENT DOCUMENTS

| 60-117498 | 6/1985 | Japan . |
| 61-80598 | 4/1986 | Japan . |
| 1-173654 | 7/1989 | Japan . |

OTHER PUBLICATIONS

"On–Chip High–Voltage Generation in MNOS Integrated Circuits Using an Improved Voltage Multiplier Technique", Dickson, J.F., IEEE Journal of Solid-State Circuits, vol. SC–11, No. 3, pp. 374–378, Jun. 1976.

Digest of Technical papers, Session 10, Tham 10.3, D'Arrigo et al., IEEE, ISSCC 89, pp. 132–133, Feb. 16, 1989.

*Primary Examiner*—A. Zarabian
*Attorney, Agent, or Firm*—Finnegan, Henderson, Farabow, Garrett & Dunner, L.L.P.

[57] ABSTRACT

A voltage multiplier circuit for raising an input voltage to a predetermined voltage is characterized in that a plurality of multiplier cells for raising an input voltage to be outputted, and a connection switching circuit for switching a connection state of these multiplier cells are provided, and the connection switching circuit connects multiplier cell groups formed by connecting one or a plurality of the multiplier cells, in parallel to an output, and varies the number of the multiplier cells of the multiplier cell groups and that of the multiplier cell groups.

47 Claims, 15 Drawing Sheets

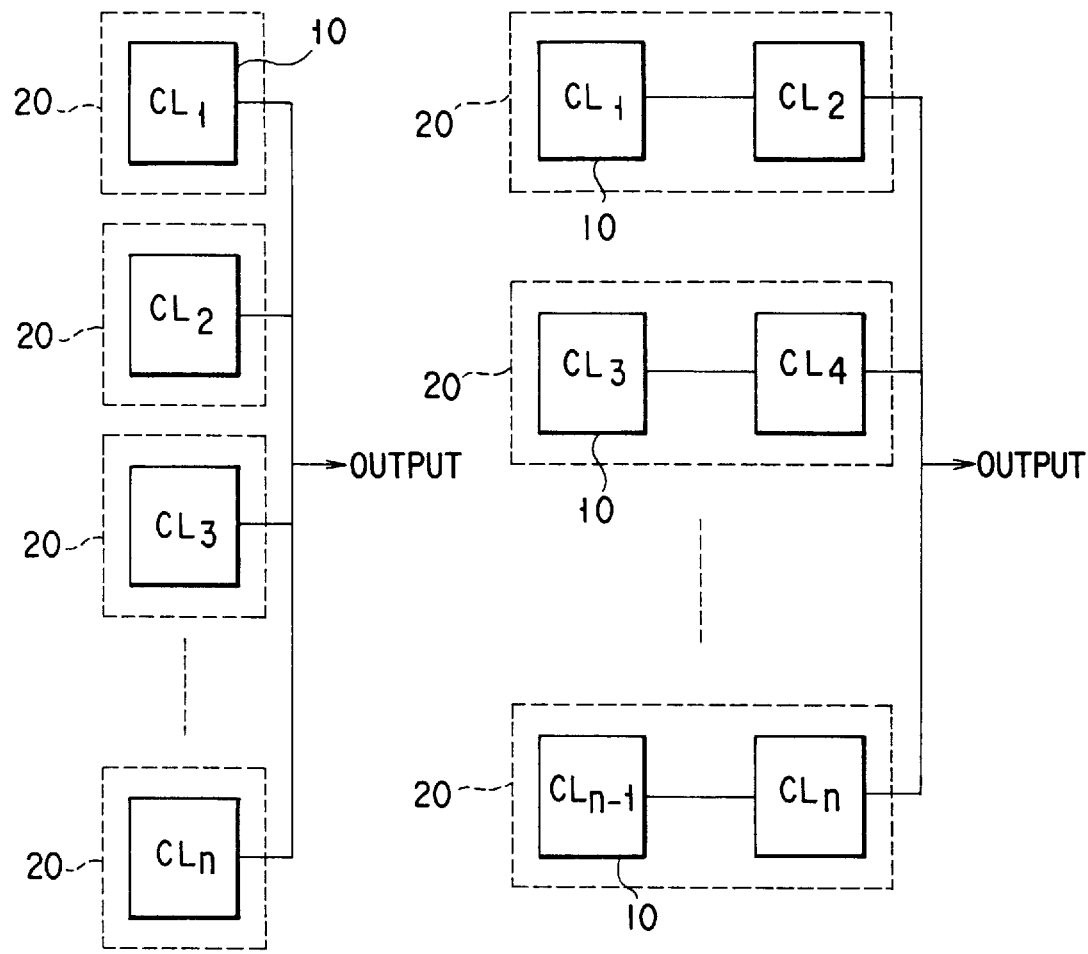
F I G. 5A    F I G. 5B
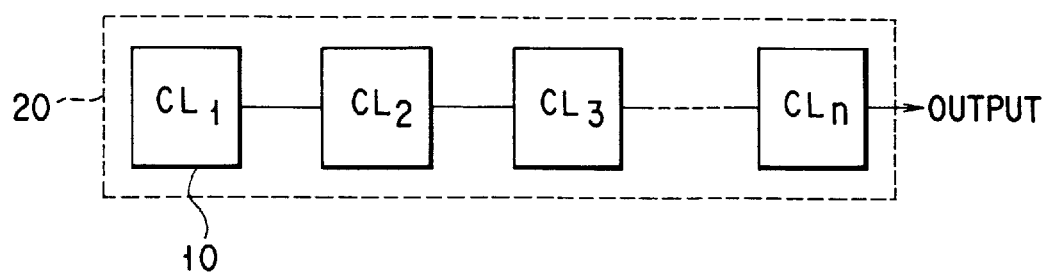
F I G. 5C

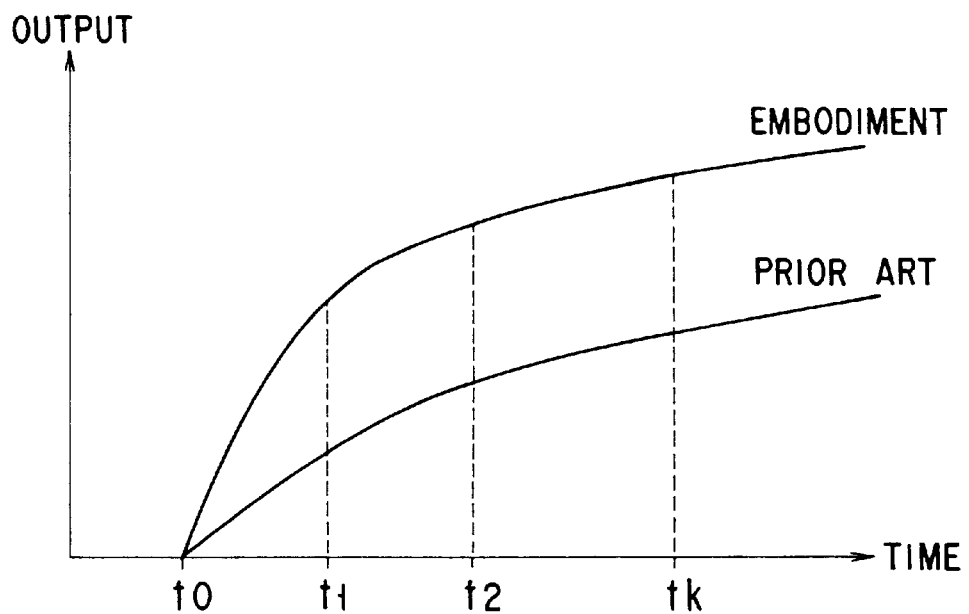
F I G. 6
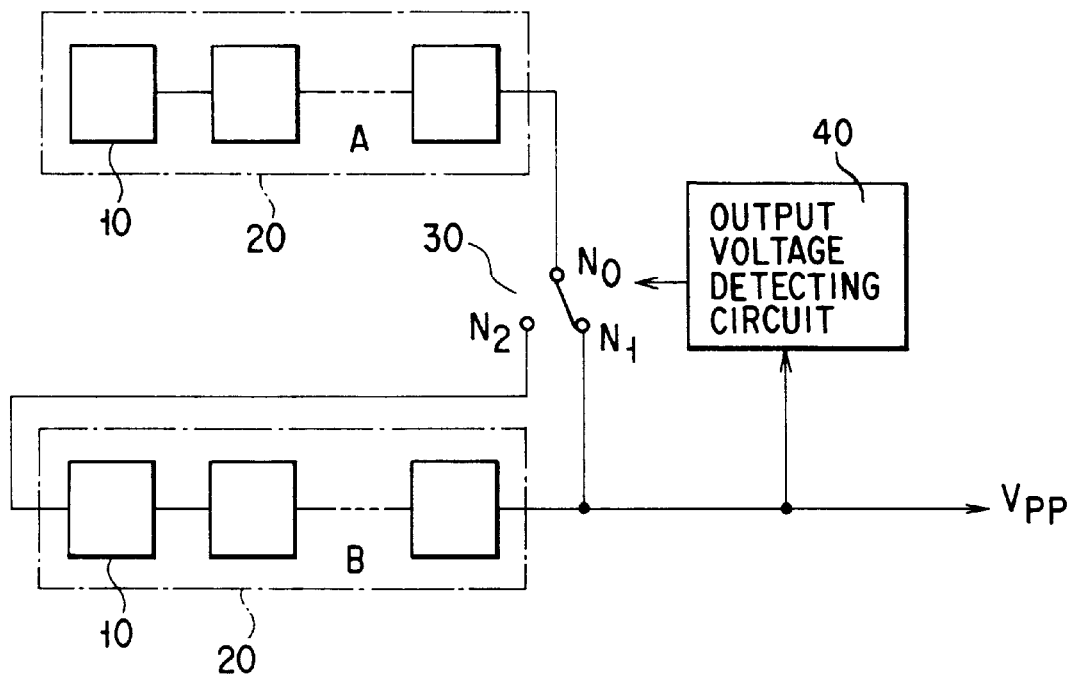
F I G. 7

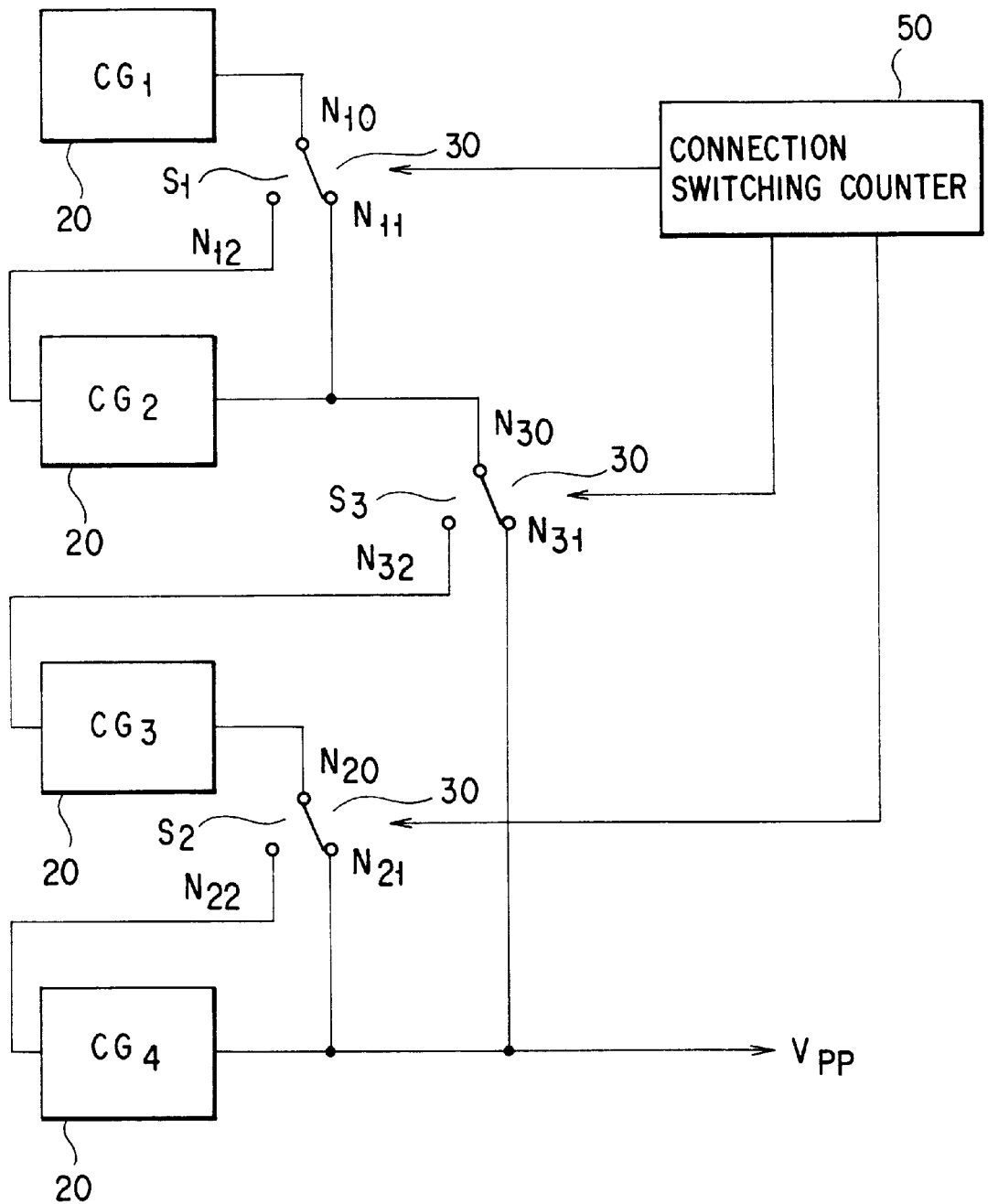
F I G. 8

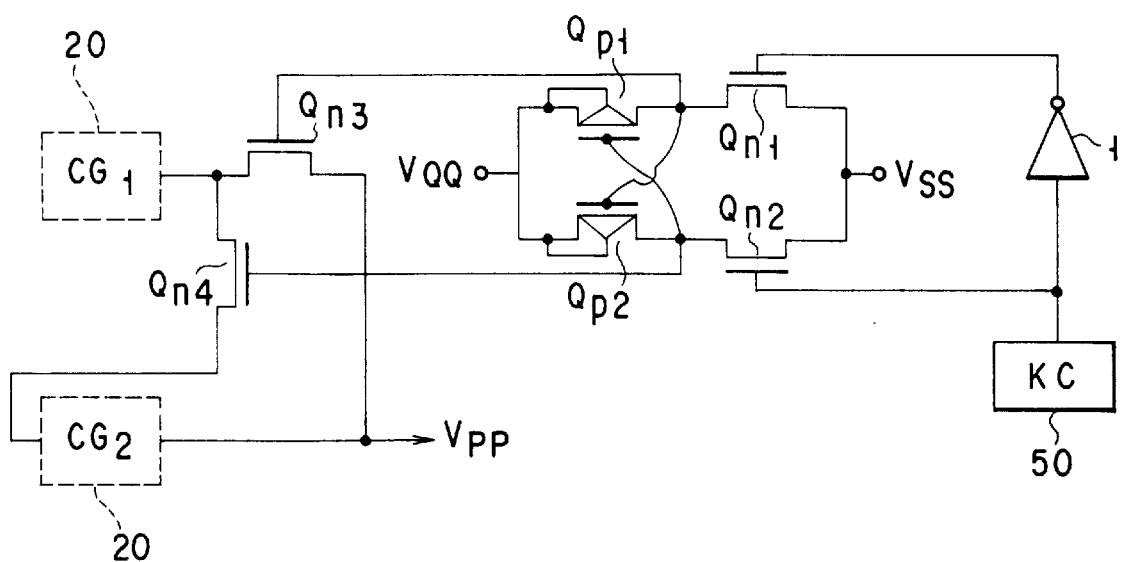
F I G. 10
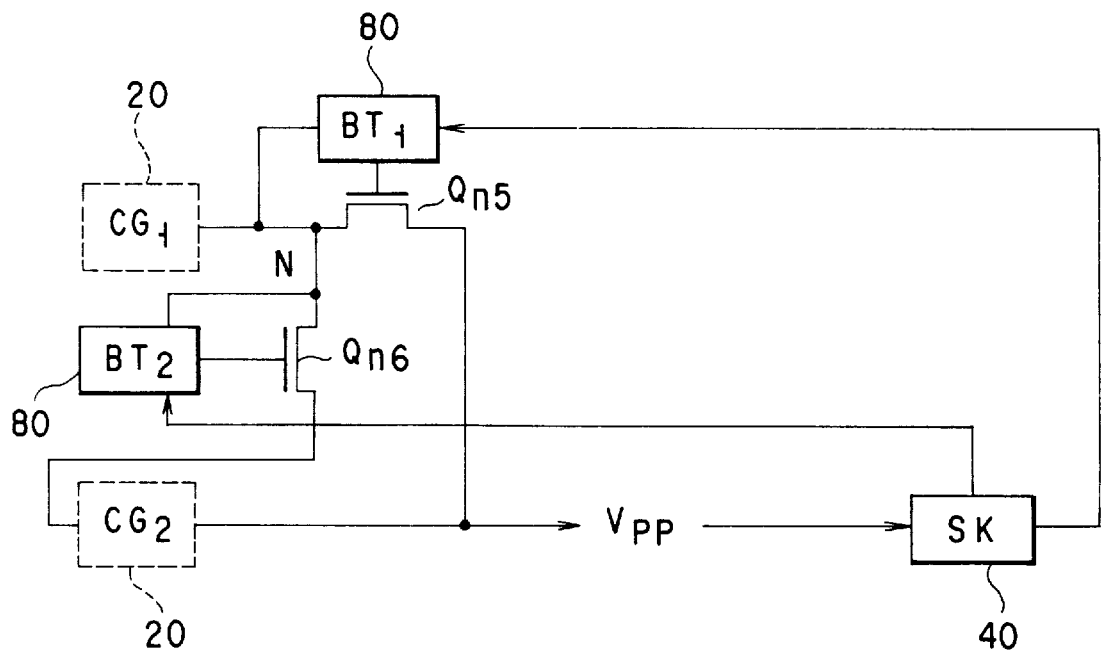
F I G. 11

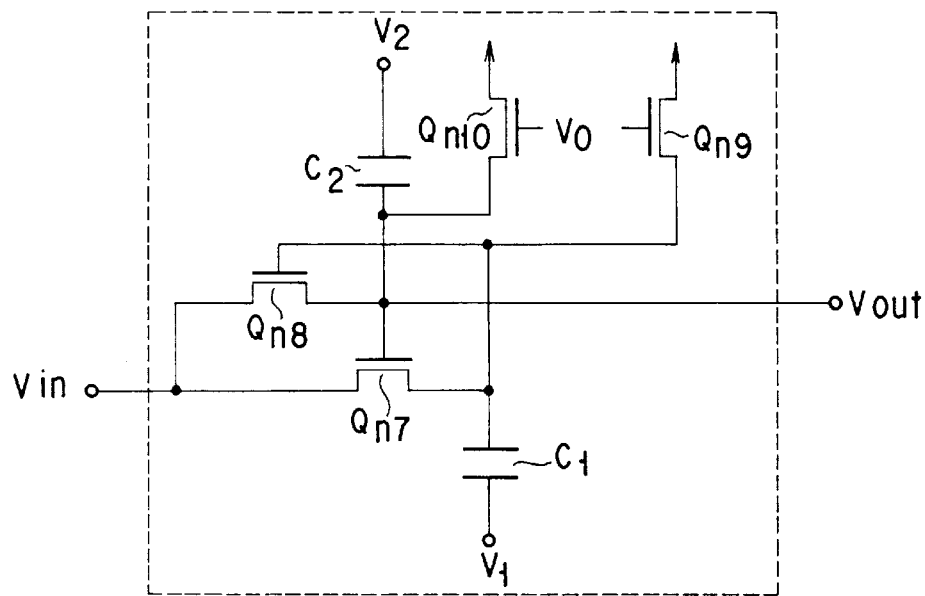
F I G. 12
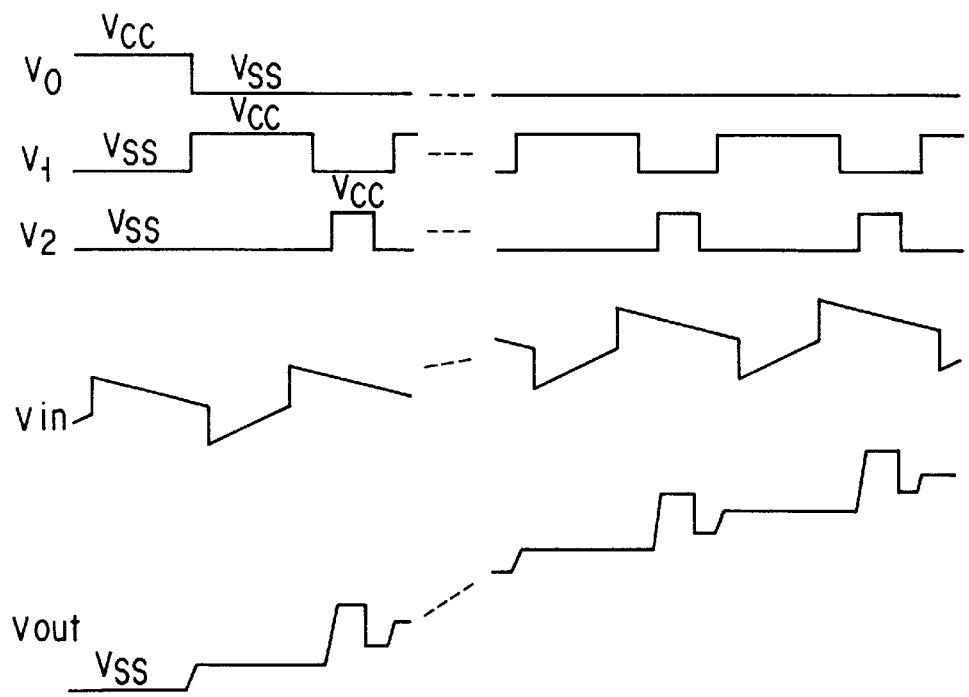
F I G. 13

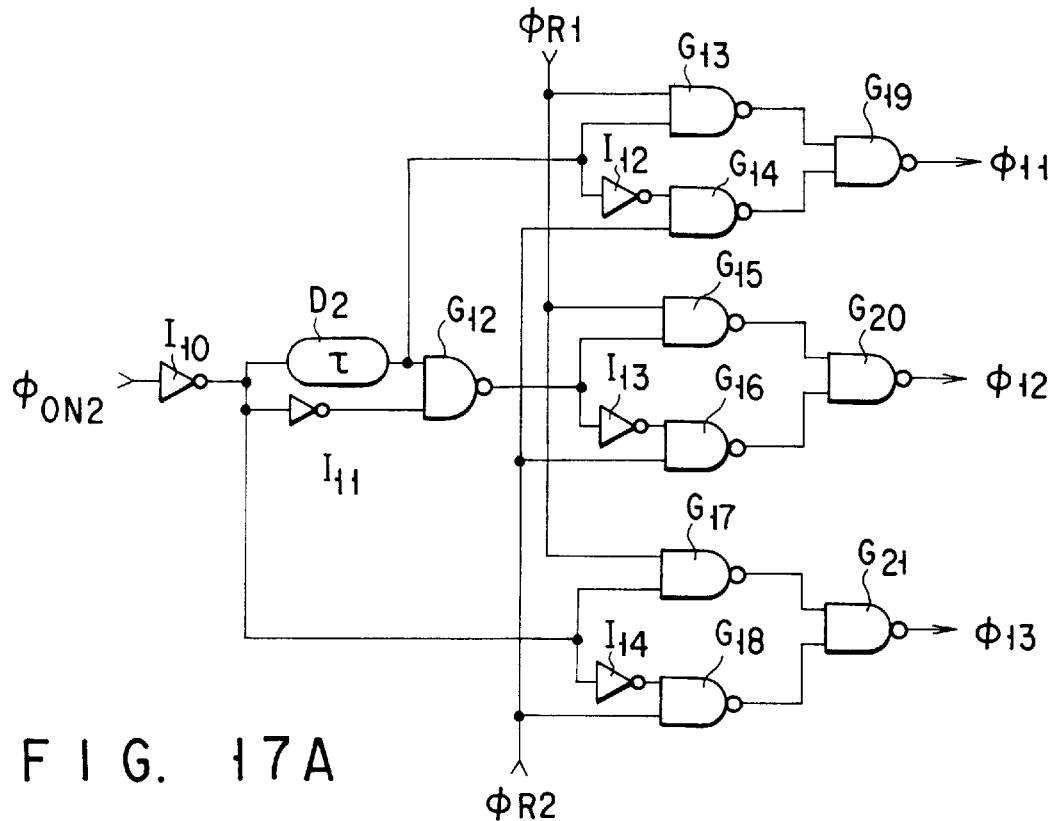
F I G. 17A
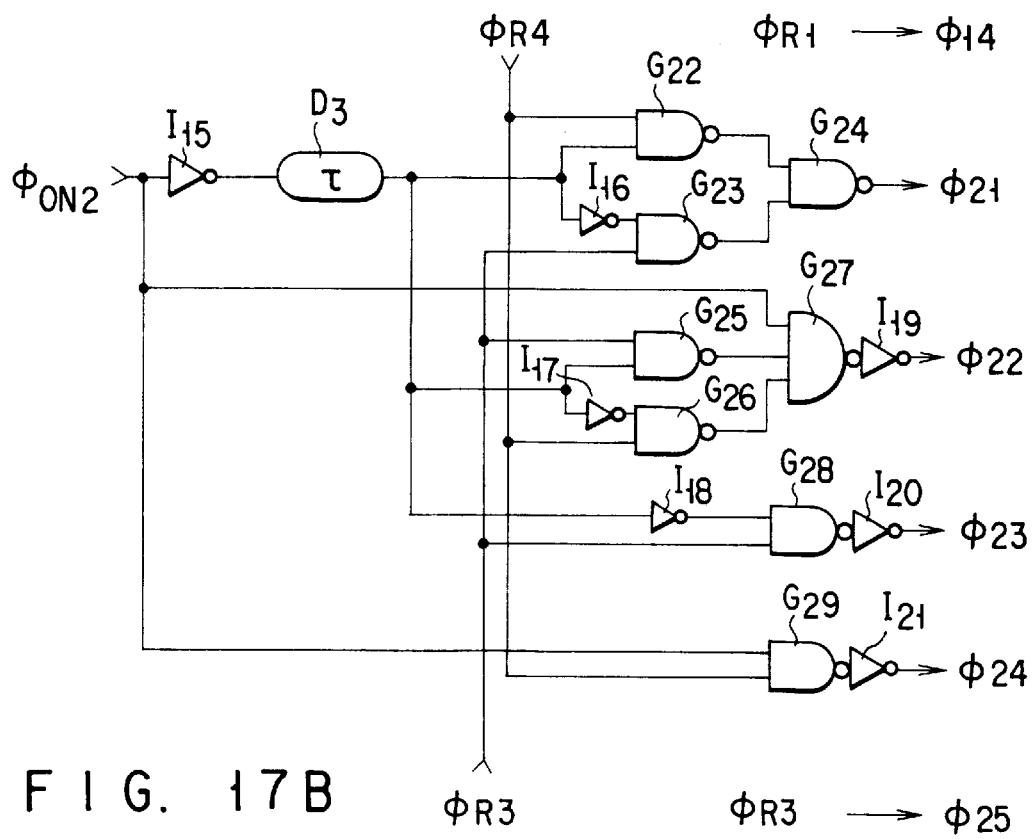
F I G. 17B

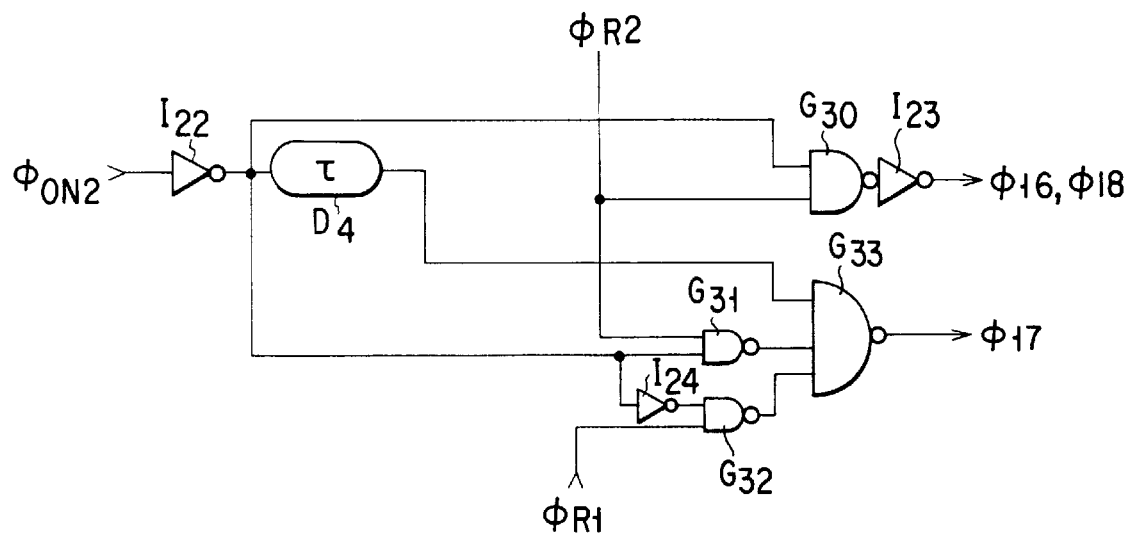
F I G. 18A
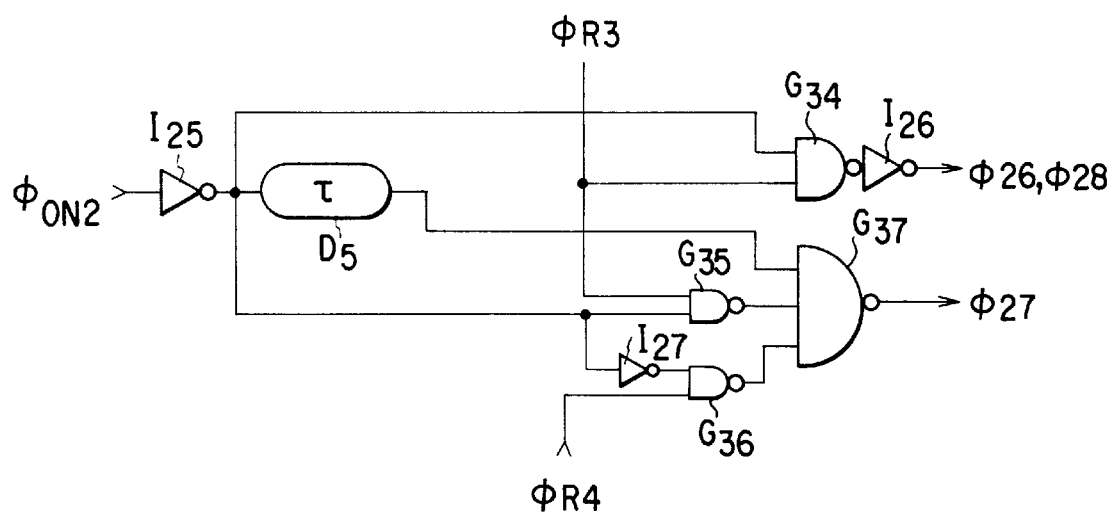
F I G. 18B

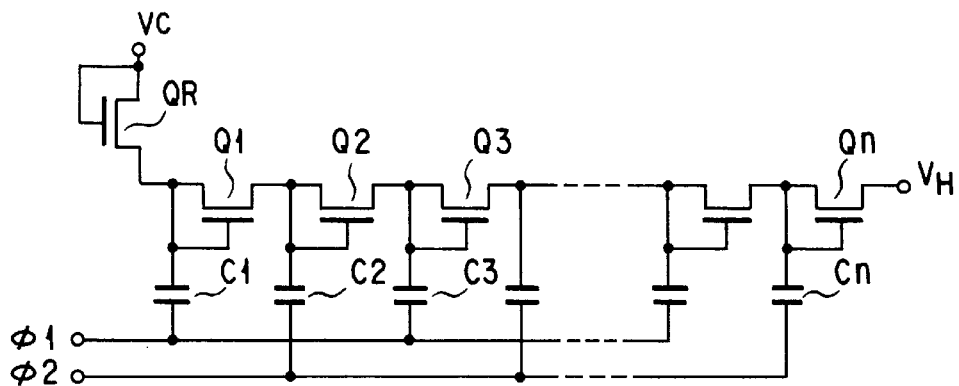
F I G. 21
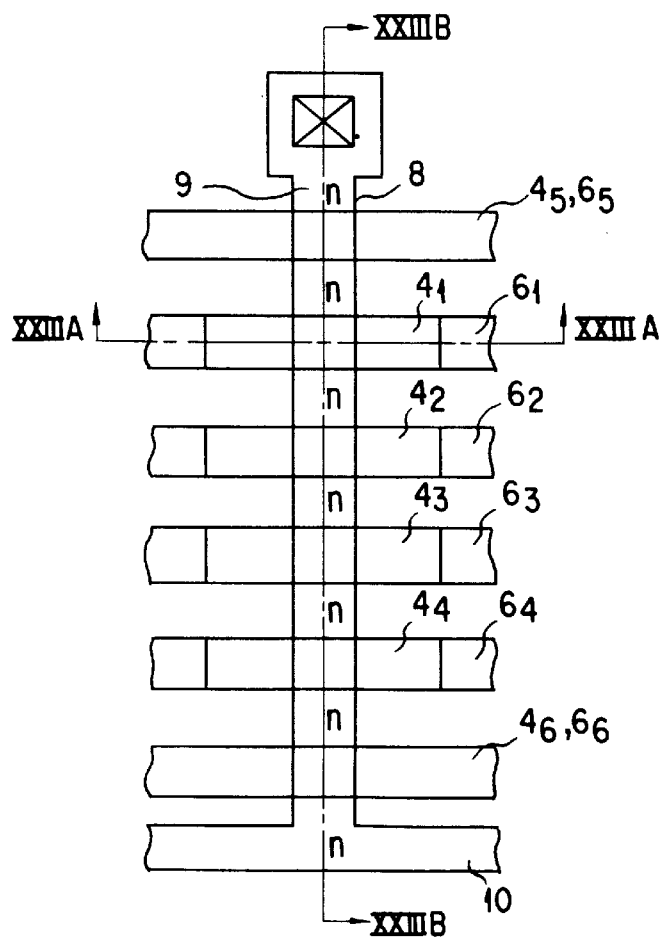
F I G. 22

5,969,988

VOLTAGE MULTIPLIER CIRCUIT AND NONVOLATILE SEMICONDUCTOR MEMORY DEVICE HAVING VOLTAGE MULTIPLIER

This application is a continuation of application Ser. No. 08/291,692 filed Aug. 16, 1994, now abandoned.

BACKGROUND OF THE INVENTION

1. Field of the Invention

The present invention relates to a voltage multiplier circuit and a nonvolatile semiconductor memory device having the voltage multiplier circuit, and particularly to improvement of a voltage multiplier formed in a semiconductor integrated circuit device such as an EEPROM.

2. Description of the Related Art

Conventionally, in a semiconductor nonvolatile semiconductor memory device (EEPROM), since a voltage, which is higher than a power supply voltage, is needed at the time of writing and erasing a signal, there is used a voltage multiplier to which a plurality of multiplier cells CL are connected in series as shown in FIG. 1. The multiplier cell CL comprises a capacitor C and a switching element Q as shown in FIG. 2A and FIG. 2B. The specific structure of the voltage multiplier circuit is shown in FIG. 3A, and clocks $\phi$, $/\phi$ for driving the circuit are shown in FIG. 3B.

In the voltage multiplier circuit, the number of multiplier cells to be connected in series for an output is determined in accordance with the value of high voltage as required, and the voltage multiplier circuit is generally driven with the unchanged number of the multiplier cells. Therefore, in the conventional voltage multiplier circuit, charge transfer efficiency is unnecessarily dropped for a period of time when the smaller number of the multiplier cells connected in series is sufficient for multiplier voltage start up. Due to this, there was a problem in that it took much time to obtain a necessary voltage.

As mentioned above, in the conventional voltage multiplier circuit formed in the semiconductor integrated circuit device such as EEPROM, etc, there was a problem in that charge transfer efficiency is unnecessarily dropped and a large amount of multiplier voltage rising time was required for a period of time when the required number of the multiplier cells to be connected in series may be smaller than the predetermined number of the multiplier cells.

SUMMARY OF THE INVENTION

In consideration of the above-mentioned problem, the present invention has been made, and an object of the present invention is to provide a voltage multiplier circuit, which can increase charge transfer efficiency for a period of time when an output voltage is low, and which can shorten a multiplier voltage rising time, a nonvolatile semiconductor memory device having such a voltage multiplier circuit.

In order to solve the above-mentioned problem, according to the present invention, there is provided a first voltage multiplier circuit comprising; a plurality of multiplier cells for raising an input voltage to output a multiplied voltage, the plurality of multiplier cells divided into multiplier cell groups, the multiplier cell groups connected in parallel to an output and having one or a plurality of multiplier cells connected in series, and a connection switching circuit for changing a connection state of the multiplier cells, and the connection switching circuit changing the number of multiplier cells of the multiplier cell groups and the number of multiplier cell groups.

As a specific form of the above first voltage multiplier circuit, the following points can be described:

(1) Changing the connection state of the multiplier cell during the drive of the voltage multiplier circuit;

(2) The multiplier groups are driven by a plurality of clocks whose phases are set to transfer electrical charges in a direction of an output;

(3) The connection switching circuit increases the number of the multiplier cells in the multiplier cell group in accordance with the rise of the output voltage;

(4) The connection switching circuit increases the number of the multiplier cells in the multiplier cell group in accordance with the rise of the output voltage, and decreases the number of multiplier cell groups at the same time;

(5) When the number of the multiplier cell groups is N, and the number of the multiplier cells of i ($1 \leq i \leq N$) multiplier cell group is Mi, the connection switching circuit reduces N such that the total obtained by integrating Mi by i is constant in accordance with the rise of the output voltage;

(6) The connection switching is performed at a predetermined time; and (7) The connection switching is performed on an external command.

Also, according to the present invention, there is provided a second voltage multiplier circuit comprising;

a plurality of multiplier cells for raising an input voltage to output a multiplied voltage, the plurality of the multiplier cells comprising a capacitor for multiplier and a charge transfer gate, the plurality of the multiplier cells connected in series to an output, and driven by a plurality of pulse voltages whose phases are set to transfer electrical charges in a direction of the output; a plurality of parallel connecting means for directly outputting electrical charges of the multiplier cell to the output; and number of stages and capacity varying means for varying the number of multiplier cells where electrical charges are outputted in series and the number of multiplier cells where electrical charges are directly outputted to the output. The number of stages and capacity varying means is characterized in that for a period of time when the output voltage is relatively low, the number of multiplier capacitors connected in parallel is increased and the number of multiplier cells connected in series to the output is reduced, and in accordance with the rise of the output voltage, the number of multiplier capacitors connected in parallel is reduced and the number of multiplier cells connected in series to the output is increased.

As a specific form of the above second voltage multiplier circuit, the following points can be described:

(1) In the voltage multiplier circuit having first and second multiplier cell groups in which the plurality of the multiplier cells are connected in series, the output of the first multiplier cell group is connected to an input of the second multiplier cell group. An electrical charge transfer gate is provided between the output of the first multiplier cell group and that of the voltage multiplier circuit. For a period of time when the output voltage of the voltage multiplier circuit is relatively low, the clock for driving the multiplier cells is set such that the first and second multiplier cell groups are connected in parallel to the output of the voltage multiplier circuit. As a result, the capacity of the multiplier circuit can be relatively large, and the number of the multiplier cells to be connected in series to the output can be relatively small. When the output voltage of the voltage multiplier circuit is relatively large, the clock for driving the multiplier cells is set such that the first and second multiplier cell groups are connected in series to the output of the voltage multiplier circuit. In other words, the output of the first cell group is used as an input of the second multiplier cell group. As a result, the capacity of the multiplier capacitor can be relatively small, and the number of the multiplier cells to be connected in series to the output can be relatively large;

(2) The change of the number of the multiplier cells to be connected in series to the output and that of the capacity of the multiplier capacitor are performed by detecting the output voltage of the voltage multiplier circuit and comparing the detected output voltage with a predetermined reference voltage;

(3) The change of the number of the multiplier cells to be connected in series to the output and that of the capacity of the multiplier capacitor are performed at a predetermined time; and (4) The change of the number of the multiplier cells to be connected in series to the output and that of the capacity of the multiplier capacitor are performed on an external command.

Moreover, according to the present invention, there is provided a nonvolatile semiconductor memory device having a voltage multiplier circuit for generating a voltage higher than a power supply voltage, and the voltage multiplier circuit comprising first and second multiplier cell groups in which a plurality of multiplier cells are connected in series; a connection switching circuit for switching a connection state of the first and second multiplier cell groups, the connection switching circuit having a first MOS transistor connected between an output terminal of the first multiplier cell group and that of the second multiplier cell group and a second MOS transistor connected between the output terminal of the first multiplier cell group and an input terminal of the second multiplier cell group; and a signal voltage generating circuit for generating a signal voltage to be inputted to the first and second MOS transistors such that the first and second MOS transistors are selectively turned on/off.

As a specific form of the above nonvolatile semiconductor memory device, the following points can be described:

(1) There are provided a first boot circuit wherein the output terminal of the first multiplier cell group is used as an input, and a boot output is connected to a gate of the first MOS transistor, a second boot circuit wherein the output terminal of the first multiplier cell group is used as an input, and a boot output is connected to a gate of the second MOS transistor. The first and second MOS transistors are selectively turned on by the signal to be inputted to the first and second boot circuits; and (2) The boot circuit comprises a capacitor C1, a capacitor C2, and MOS transistors Qn7 to Qn10. In the capacitor C1, a pulse V1 is inputted to one end. In the capacitor C2, a pulse V2 is inputted to one end. In the MOS transistor Qn7, a connection terminal of the first multiplier cell group is connected to a drain, the other end of the capacitor C1 is connected to a source, and the output of the voltage multiplier circuit and other end of the capacitor C2 are connected to the gate. In the MOS transistor Qn8, the connection terminal of the first multiplier cell group is connected to the drain, the output of the voltage multiplier circuit is connected to the source, and the other end of the capacitor C1 is connected to the gate. In the MOS transistor Qn9, a low voltage of an outer unit is connected to the source, the other end of the capacitor C1 is connected to the drain, a signal, which reverses a logic value when the output of the voltage multiplier circuit is switched, is inputted to the gate. In the MOS transistor Qn10, the low voltage of the outer unit is connected to the source, the other end of the capacitor C2 is connected to the drain, a signal, which reverses a logic value when the output of the voltage multiplier circuit is switched, is inputted to the gate.

According to the present invention, there can be used a voltage multiplier circuit in which a large number of multiplier cells are connected in parallel to the output when the output voltage of the voltage multiplier circuit is low, thereby improving charge transfer efficiency as compared with the conventional voltage multiplier circuit, which is driven in a state that the number of the multiplier cells connected in series is fixed for a period of time when the output voltage is low.

For example, in the voltage multiplier circuit in which N number of multiplier cells are connected, N number of multiplier cells are connected in parallel at the time when the voltage multiplier circuit is started to be driven. Thereby, in a case that a load capacity of the voltage multiplier circuit is sufficiently larger, there can be obtained supply current, which is N times larger than a case that N number of multiplier cells are connected in series. As a result, the multiplier voltage rising can be made faster. Then, the number of the multiplier cells connected in parallel is reduced in accordance with the rise of the voltage, and the number of the multiplier cells connected in series is increased, so that the necessary voltage can be obtained.

As mentioned above, in order to make charge transfer efficiency of the voltage multiplier circuit suitable, the voltage multiplier circuit is structured in such a form that the number of the multiplier cells connected in series is small and the number of the multiplier cells connected in parallel is large at the time when the voltage multiplier circuit starts. Then, in accordance with the rise of the output voltage, the structure of the voltage multiplier circuit is changed in such a form that the number of the multiplier cells connected in series is large and the number of the multiplier cells connected in parallel is small. Thereby, charge transfer efficiency becomes higher than the conventional voltage multiplier circuit. As a result, multiplier voltage rising time can be shortened. Also, by this method, it is possible to vary the output level.

Moreover, according to the nonvolatile semiconductor memory device having such a voltage multiplier circuit, multiplier voltage rising time can be shortened, thereby making it possible to obtain a high speed performance. Also, even in the same specification of the rising time as the conventional case, since the cell capacity can be made small, low electric power supply is sufficient for the multiplier circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a schematic structure of a conventional voltage multiplier circuit;

FIGS. 5A, 5B and 5C are schematic views showing a connection state of a multiplier cell group of the first embodiment of the present invention;

FIG. 6 is a characteristic view showing a comparison of an output-time characteristics between the first embodiment of the present invention and the conventional case;

FIG. 7 is a block diagram showing a schematic structure of a voltage multiplier circuit of the second embodiment of the present invention;

FIG. 8 is a block diagram showing a schematic structure of a voltage multiplier circuit of the third embodiment of the present invention;

FIG. 10 is a circuit structural view showing the specific structure of a connection switching circuit of a voltage multiplier circuit of the fifth embodiment of the present invention;

FIG. 11 is a circuit structural view showing the specific structure of a connection switching circuit of a voltage multiplier circuit of the sixth embodiment of the present invention;

FIG. 12 is a circuit structural view showing the specific structure of a boot circuit used in the voltage multiplier circuit of FIG. 11;

FIG. 13 is a view of a signal waveform of each portion in the boot circuit of FIG. 12;

FIGS. 17A and 17B are views showing a drive pulse generating circuit of the eighth embodiment of the present invention;

FIGS. 18A and 18B are views showing a drive pulse generating circuit of the eighth embodiment of the present invention;

FIG. 21 is a circuit structural view showing a conventional voltage multiplier circuit used in a NAND type nonvolatile memory;

FIG. 22 is a plan view of a EEPROM NAND cell;

DETAILED DESCRIPTION OF THE PREFERRED EMBODIMENTS

Embodiments of the present invention will be explained with reference to the drawings.

First Embodiment

Figure 4:
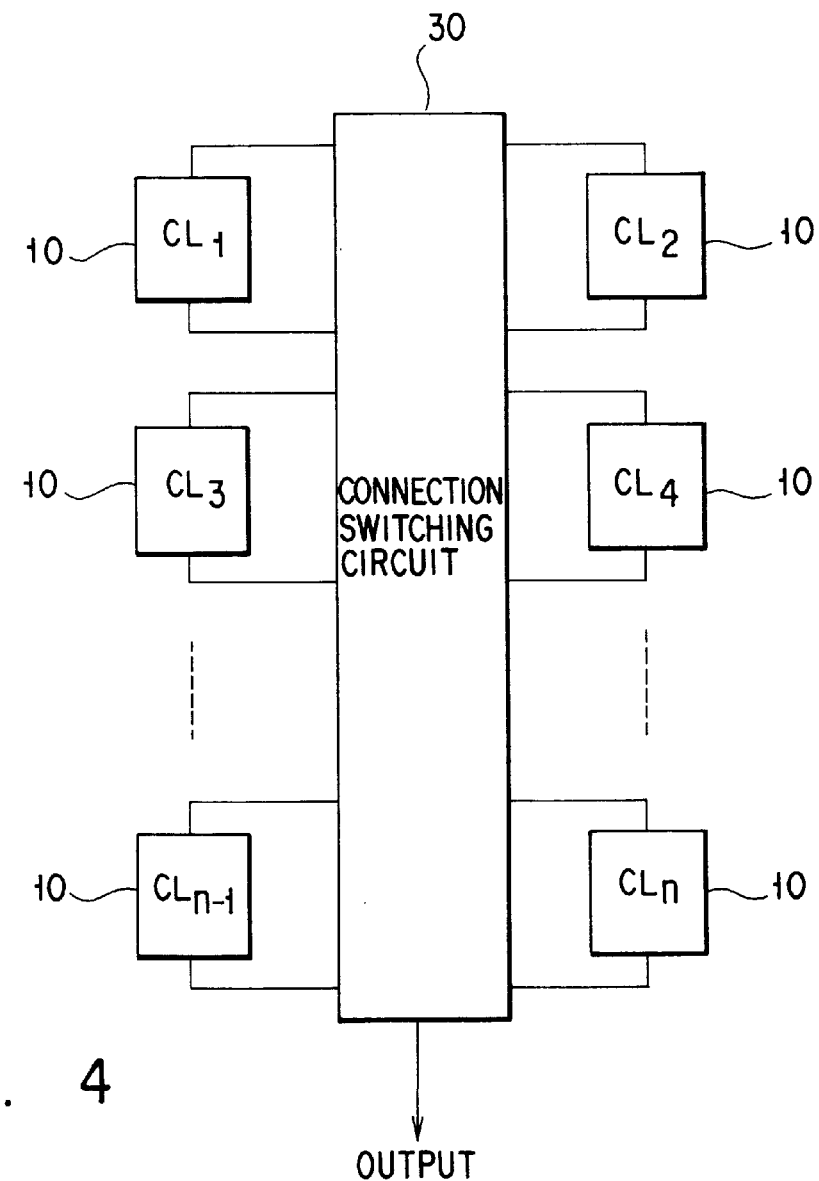
FIG. 4 is a block diagram showing a schematic structure of a voltage multiplier circuit of the first embodiment of the present invention.

FIG. 4 is a block diagram showing a schematic structure of a voltage multiplier circuit of the first embodiment of the present invention. The voltage multiplier circuit comprises n number of multiplier cells 10 (CL1, CL2, . . . CLn), and a connection switching circuit 30. As shown in FIG. 2, each of the multiplier cells 10 comprises a capacitor and a switching element. The connection switching circuit 30 comprises a large number of switching elements. The connection switching circuit 30 connects one or a plurality of multiplier cells 10 in series to form a plurality of sets of multiplier cell groups 20 and connects these multiplier cell groups 20 in parallel to the output. Moreover, the number of multiplier cells 10 of a multiplier cell group 20 and the number of the multiplier cell groups 20 can be varied.

According to the above-mentioned structure, from a drive starting time t0 till time t1, n number of multiplier cells 10 are structural elements of one multiplier cell group 20 as shown in FIG. 5A, and these cells are connected in parallel to the output, and driven.

The structure of the multiplier cell groups 20 and the connection are changed at time t1, and each multiplier cell group 20 is formed of two multiplier cells 10 connected in series as shown in FIG. 5B. At this time, the number of the multiplier cell groups 20 connected in parallel to the output is n/2.

Similarly, from time t2 to time tk-1, the structure of the multiplier cell groups 20 and the connection are changed, and the number of the multiplier cells 10 of the multiplier cell group 20 is increased, and the number of the multiplier cell groups 20 is decreased.

After time tk, as shown in FIG. 5C, there is formed one multiplier cell group 20 in which n number of multiplier cells 10 are all connected in series to the output, and the multiplier cell group drives the output.

As shown in FIG. 1, the conventional voltage multiplier circuit is formed of n number of multiplier cells connected in series, and drives the output with connection unchanged after the drive starting time t0.

FIG. 6 is characteristic curves showing a comparison of an output voltage between this embodiment of the present invention and the conventional case. In order to make charge transfer efficiency of the voltage multiplier circuit suitable, the voltage multiplier circuit is structured in such a form that the number of the multiplier cells connected in series is small and the number of the multiplier cells connected in parallel is large at the drive starting time. Then, in accordance with the rise of the output voltage, the structure of the multiplier circuit is changed in such a form that the number of the multiplier cells connected in series is large and the number of the multiplier cells connected in parallel is small.

Thereby, charge transfer efficiency becomes higher than the conventional voltage multiplier circuit. As a result, multiplier voltage rising time can be shortened.

According to the above-mentioned embodiment, the number of the multiplier cell groups 20 connected in parallel to the output and the number of the multiplier cells 10 of each multiplier cell group 20 can be varied in accordance with the rise of the output voltage, whereby charge transfer efficiency can be improved and, particularly multiplier voltage rising time can be shortened. Due to this, in a case that this voltage multiplier circuit is applied to EEPROM, writing and erasing time of EEPROM can be shortened.

Second Embodiment

FIG. 7 is a block diagram showing a schematic structure of a voltage multiplier circuit of a second embodiment of the present invention. The voltage multiplier circuit of the second embodiment comprises two multiplier cell groups 20 (A, B), and a connection switching circuit 30, and an output voltage detecting circuit 40.

Each of multiplier cell groups A and B comprises a plurality of multiplier cells 10. The connection switching circuit 30 switches the connection of these multiplier cell groups by use of an input signal. For example, the connection switching circuit 30 comprises MOS transistors. The output voltage detecting circuit 40 compares an output voltage Vpp of the voltage multiplier circuit with a predetermined voltage, and outputs a logic value in accordance with the level of these voltages.

After the start of driving, a connection node N0 of the multiplier cell group A is connected to a connection node N1 of the multiplier cell group B by the connection switching circuit 30, and these multiplier cell groups A and B are connected in parallel to the output, and driven. If the output voltage Vpp of the voltage multiplier circuit is higher than a predetermined voltage, the output of the output voltage detecting circuit 40 reverses the logic value, and the connection node N0 of the multiplier cell group A is switched to a connection node N2 of the multiplier cell group B. Thereafter, these multiplier cell groups A and B are connected in series to the the output, and driven.

According to the above-mentioned embodiment, when the output voltage is low, the multiplier cell groups A and B are connected in parallel and the rise of the multiplier voltage is made faster, thereafter, the multiplier cell groups A and B are connected in series, so that sufficient multiplier voltage can be obtained. Therefore, charge transfer efficiency can be improved, and the same advantage as the first embodiment can be obtained.

Third Embodiment

FIG. 8 is a block diagram showing a schematic structure of a voltage multiplier circuit of a third embodiment of the present invention. This voltage multiplier circuit comprises the multiplier cell groups (CG1, . . . CG4), the connection switching circuits (S1, S2, S3), and a connection switching counter 50.

The connection switching counter 50 counts time from the start of driving. If time is longer than predetermined time, the output of the connection switching counter 50 reverses the logic value. After the start of driving, a connection mode N10 of a multiplier cell group CG1 is connected to a connection node N11 of a multiplier cell group CG2 by the connection switching circuit S1. Similarly, connection nodes N20 and N30 are connected to connection nodes N21 and N31, respectively.

If the first predetermined time is passed since drive starting time, in the connection of multiplier cell groups CG1 an CG2 and that of multiplier cell groups CG3 and CG4, the connection nodes N10 and N20 are switched to connection nodes N12 and N22 by connection switching circuits S1 and S2, respectively. As a result, the first multiplier cell group wherein the multiplier cells of the multiplier cell groups CG1 and CG2 are connected in series and the second multiplier cell group wherein the multiplier cells of the multiplier cell groups CG3 and CG4 are connected in series are connected in parallel, and these first and second multiplier cell groups are incorporated into the circuit structure.

If the second predetermined time is passed, a connection node N30 is connected to a connection node 32, so that the first and second multiplier cell groups are connected in series to the output. In other words, after passing the second predetermined time, there is formed the circuit structure by a single multiplier cell group in which all multiplier cells of the first and second multiplier cell groups are connected in series to the output.

According to the above-mentioned embodiment, the relationship of the connection between the multiplier cell groups CG1 to CG4 is switched from the parallel connection structure of the multiplier cell groups CG1 to CG4, to the parallel connection structure of the serial connection circuit of the multiplier cell groups CG1 and CG2 and the serial connection circuit of the multiplier cell groups CG3 and CG4, and to the serial connection structure of the multiplier cell groups CG1 to CG4 in order, so that charge transfer efficiency can be improved.

Fourth Embodiment

Figure 9:
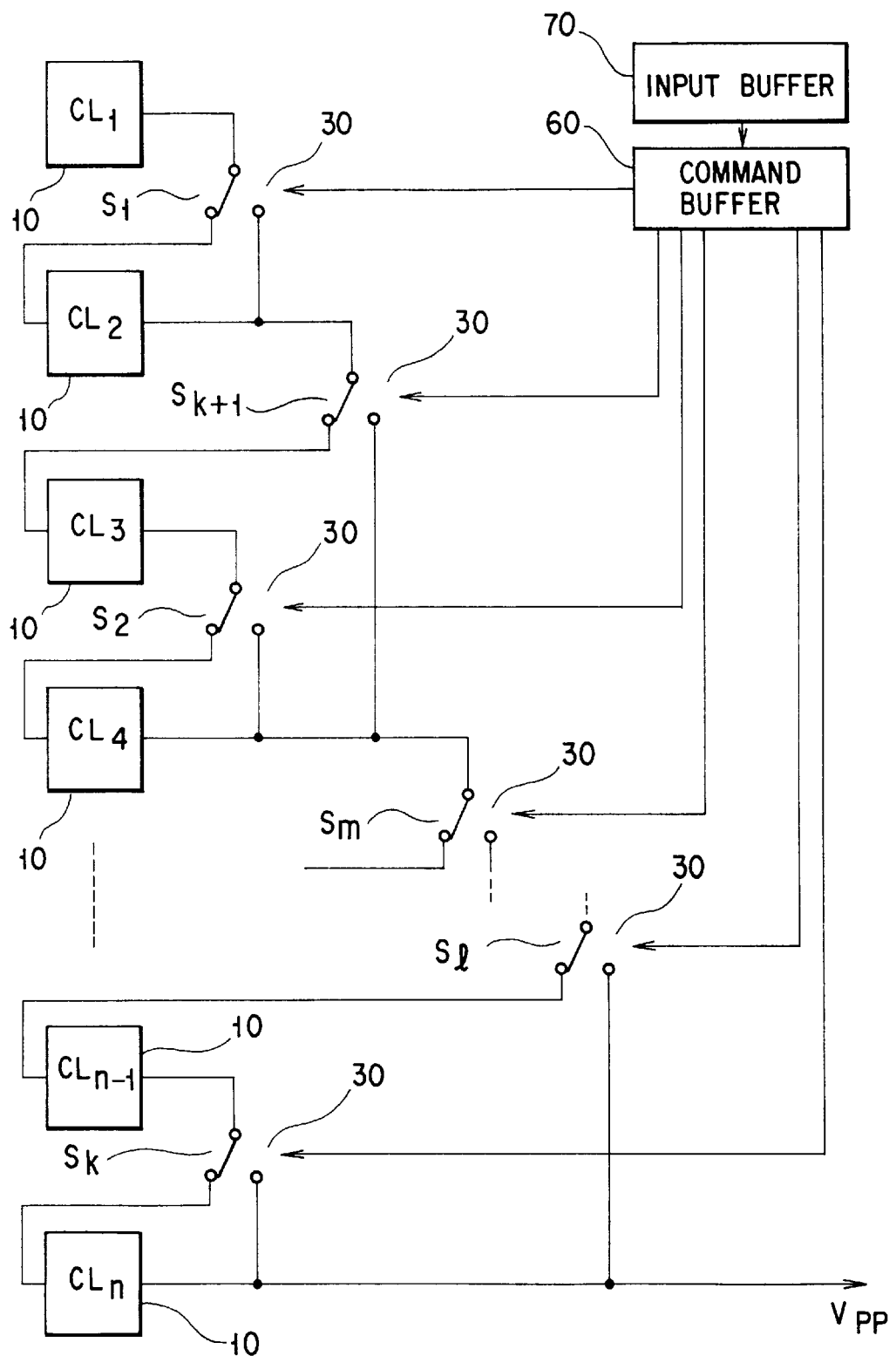
FIG. 9 is a block diagram showing a schematic structure of a voltage multiplier circuit of the fourth embodiment of the present invention.

FIG. 9 is a block diagram showing a schematic structure of a voltage multiplier circuit of a fourth embodiment of the present invention. This voltage multiplier circuit comprises n number of the multiplier cells 10 (C1 to C*n*), the connection switching circuit 30 (S1 to S*m*), a command buffer 60, and an input buffer 70.

The connection switching circuit 30 of this embodiment is that the connection switching circuit 30 of the third embodiment is expanded. In this connection switching circuit 30, in accordance with the time passing, the parallel connection of n number of the multiplier cell groups having one multiplier cell, the parallel connection of n/2 number of the multiplier cell groups having two multiplier cells, the parallel connection of n/4 number of the multiplier cell groups having four multiplier cells, . . . are sequentially switched.

In this circuit, if the external command is inputted to the input buffer 70 after drive starting time, the connection between the multiplier cells 10 is switched through the command buffer 60 by the connection switching circuit 30. Then, the number of the multiplier cell groups connected in parallel to the output of the voltage multiplier circuit is decreased every time when the input is performed.

Fifth Embodiment

FIG. 10 shows a voltage multiplier circuit of a fifth embodiment of the present invention, and a circuit structural view showing the specific structure of the connection switching circuit 30. In this embodiment, nMOS transistors Qn3 and Qn4, serving as switching elements, are connected to two multiplier cell groups 20 (CG1,CG2) each having a plurality of multiplier cells.

The nMOS transistors Qn3 and Qn4 are provided to switch the connection of the multiplier cell groups CG1 and CG2 to the output of the voltage multiplier circuit, and the sources and drains thereof are connected to the connection node to be connected or disconnected. In other words, the drain of the first MOS transistor Qn3 is connected to the output terminal of the first multiplier cell group CG1, and the source thereof is connected to the output terminal of the second multiplier cell group CG2. The drain of the second MOS transistor Qn4 is connected to the output terminal of the first multiplier cell group CG1, and the source thereof is connected to the input terminal of the second multiplier cell group CG2.

The gate of each of nMOS transistors Qn3 and Qn4 is connected to each of two outputs of a flip-flop comprising high voltage vqq, low voltage Vss, pMOS transistors Qp1, Qp2, and nMOS transistors Qn1 and Qn2. Then, the output of the connection switching counter 50 is directly supplied to one input terminal of the flip-flop, or the other input terminal through an inverter I.

According to the above-mentioned structure, if the output of the connection switching counter 50 is high, the transistor Qn3 is turned on, and the transistor Qn4 is turned off. Therefore, the multiplier cell groups CG1 and CG2 are connected in parallel to the output of the voltage multiplier circuit. If the logic value of the output of the connection switching counter 50 reverses and becomes low, the transistor Qn3 is turned off, and the transistor Qn4 is turned on. As a result, the multiplier cell groups CG1 and CG2 are connected in series to the output of the voltage multiplier circuit.

Sixth Embodiment

FIG. 11 shows a voltage multiplier circuit of a sixth embodiment of the present invention, and a circuit structural view specifically showing another connection switching circuit. In this circuit, a boot circuit is provided in the MOS transistors for connection switching the multiplier cell groups.

The nMOS transistors Qn5 and Qn6 are provided to switch the connection of the multiplier cell groups CG1 and CG2 to the output of the voltage multiplier circuit, and the sources and drains thereof are connected to the connection node to be connected or disconnected. In other words, the drain of the MOS transistor Qn5 is connected to the output terminal of the first multiplier cell group CG1, and the source thereof is connected to the output terminal of the second multiplier cell group CG2. The drain of the transistor Qn6 is connected to the output terminal of the first multiplier cell group CG1, and the source thereof is connected to the input terminal of the second multiplier cell group CG2.

An output of a boot circuit 80 (BT1), which uses voltage of the output terminal (connection node N) of the multiplier cell group CG1 as an input, is applied to the gate of the nMOS transistor Qn5. An output of a boot circuit 80 (BT2), which uses voltage of the output terminal of the multiplier cell group CG1 as an input, is applied to the gate of the nMOS transistor Qn6. These boot circuits BT1 and BT2 are controlled by the output of the output voltage detecting circuit 40.

The output voltage detecting circuit 40 compares an output voltage vpp of the voltage multiplier circuit with a predetermined voltage, and outputs a logic value in accordance with the level of these voltages. When the output voltage Vpp of the voltage multiplier circuit is lower than the predetermined voltage, the output of BT1 becomes a boot voltage of the voltage of the connection node N of the multiplier cell group CG1, the output of BT2 becomes low voltage, the transistor Qn5 is turned on, and the transistor Qn6 is turned off. Therefore, the multiplier cell groups CG1 and CG2 are switched to the parallel connection to the output of the voltage multiplier circuit.

If the output voltage Vpp of the voltage multiplier circuit is higher than the predetermined voltage, the logic value of the output of the output voltage detecting circuit 40 is inverted, the transistor Qn5 is turned off, and the transistor Qn6 is turned on. As a result, the multiplier cell groups CG1 and CG2 are switched to the serial connection to the output of the voltage multiplier circuit.

FIG. 12 is a circuit structural view showing the specific structure of the boot circuit of FIG. 11. FIG. 13 shows an input/output waveform of the boot circuit. The boot circuit comprises a capacitor C1, a capacitor C2, an nMOS transistor Qn7, an nMOS transistor Qn8, an nMOS transistor Qn9, and an nMOS transistor Qn10. For the capacitor C1, pulse V1 is inputted to one end. For the capacitor C2, pulse V2 is inputted to one end. For the nMOS transistor Qn7, the connection node N1 of the multiplier cell group CG1 is connected to the drain, the other end of the capacitor C1 is connected to the source, and the output of the main circuit and the other end of the capacitor C2 are connected to the gate. For the nMOS transistor Qn8, the connection node N1 of the multiplier cell group CG1 is connected to the drain, the output of the main circuit is connected to the source, and the other end of the capacitor C1 is connected to the gate. For the nMOS transistor Qn9, the low voltage of the outer unit is connected to the source, the other end of the capacitor C1 is connected to the drain, and a signal V0, which reverses the logic value when the output of the boot circuit is switched, is connected to the gate. For the nMOS transistor Qn10, the low voltage of the outer unit is connected to the source, the other end of the capacitor C2 is connected to the drain, and a signal V0, which reverses the logic value when the output of the main circuit is switched, is connected to the gate.

However, in this case, if the signal voltage V0, which reverses the logic value when the output of the boot circuit is switched, is high, the pulses V1 and V2 to be inputted to one end of the capacitor C1 and that of the capacitor C2 are set to be low. If it is repeated that the pulses V1 and V2 are set to be high and low alternately such that the pulses V1 and V2 are not simultaneously high after the pulse V0 is low, the output of the main circuit approaches to the boot voltage of the connection node N1 of the multiplier cell group CG1.

By use of such a boot circuit, even in a case that the voltage to be provided to the source of the switching MOS transistor is multiplied by large number of multiplier cells and highly increased, the gate voltage of the MOS transistor can be sufficiently highly provided to the source, and the multiplier voltage outputted through the MOS transistor can be prevented from being lowered.

Seventh Embodiment

Figure 3A:
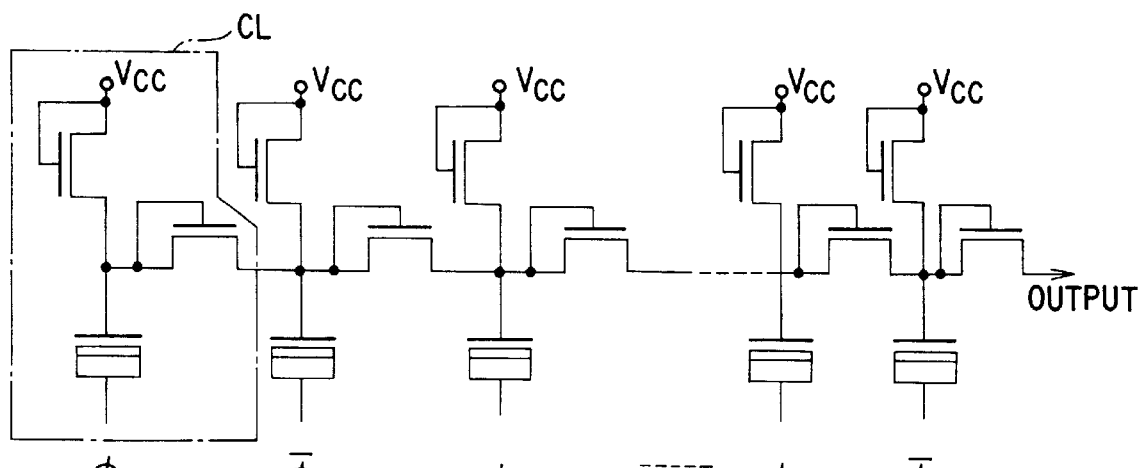
FIGS. 3A and 3B are views showing a specific circuit structure of the conventional voltage multiplier circuit and a clock waveform.
Figure 3B:
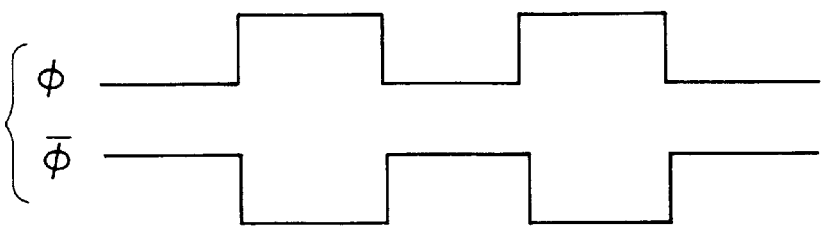
Figure 14:
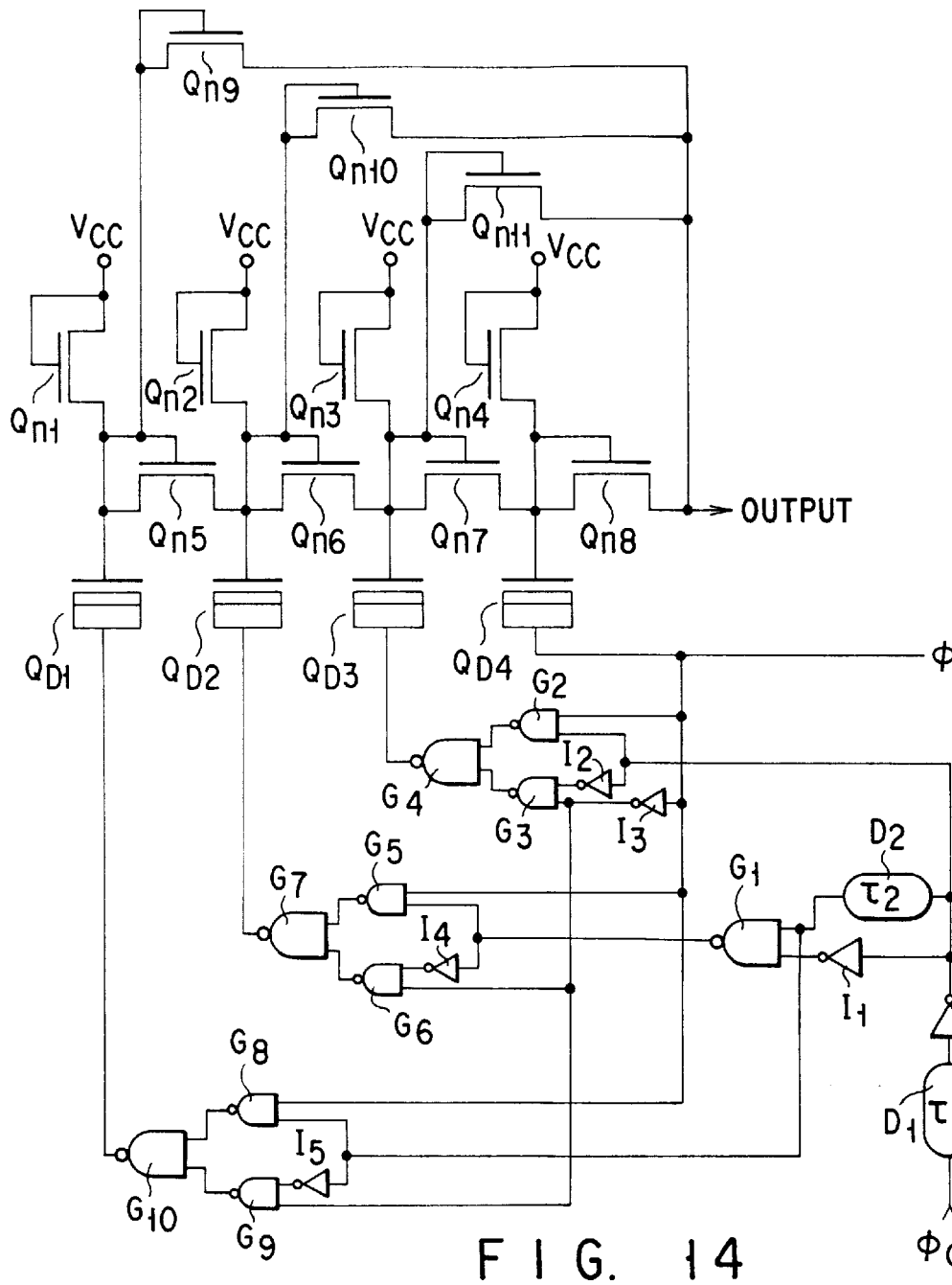
FIG. 14 is a circuit structural view showing the specific structure of a voltage multiplier circuit of the seventh embodiment of the present invention.

FIG. 14 is a circuit structural view showing the specific structure of a voltage multiplier circuit of a seventh embodiment of the present invention. The basic structure of this voltage multiplier circuit is the same as the conventional circuit of FIG. 3 (IEEE Journal of Solid-state Circuits, vol.SC-11, No. 3, June 1976, pp374–378). However, in this embodiment, number of stages capacity varying means is added to such a basic structure.

In multiplier capacitors QD1 to QD4 and charge transfer gates Qn5 to Qn8, four multiplier cells are provided, and power voltage vcc is applied to each of the multiplier cells through Qn1 to Qn4.

Figure 2A:
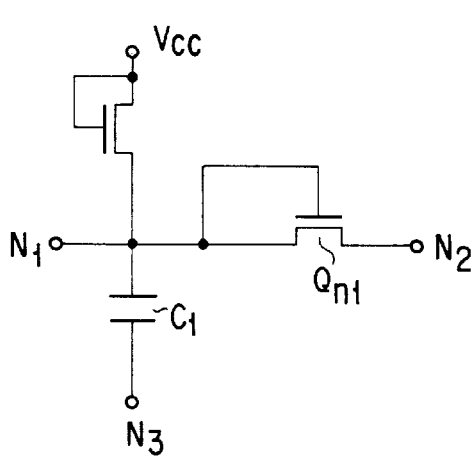
FIGS. 2A and 2B are circuit structural views showing conventional multiplier cells.
Figure 2B:
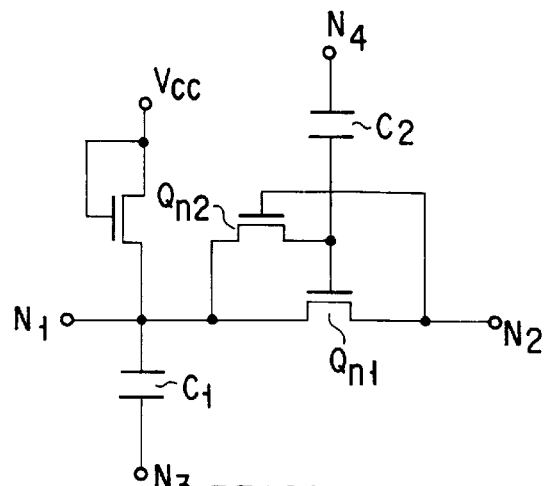

In this case, each multiplier cell is equal to the multiplier cells shown in FIG. 2A. The node N2 of the first multiplier cell (QD1, Qn5, Qn1) is connected to the node N1 of the second multiplier cell (QD2, Qn6, Qn2), the node N2 of the second multiplier cell is connected to the node N1 of the third multiplier cell (QD3, Qn7, Qn3), the node N2 of the third multiplier cell is connected to the node N1 of the fourth multiplier cell (QD4, Qn8, Qn4), and the node N2 of the fourth multiplier cell is connected to the output terminal. The above-mentioned structure is the same as conventional circuit structure.

The node N1 of the first multiplier cell is connected to the output terminal through the transistor Qn9, the node N1 of the second multiplier cell is connected to the output terminal through the transistor Qn10, and the node N1 of the third multiplier cell is connected to the output terminal through the transistor Qn11. Also, drive pulse φon is applied to the node N3 of each of the first to third multiplier cells through a logic circuit comprising a NAND gate G (G1 to G10), an inverter I ((I1 to I5), and a delay circuit D (D1, D2), and drive pulse φ is applied to the node N3 of the fourth multiplier cell.

Figure 15:
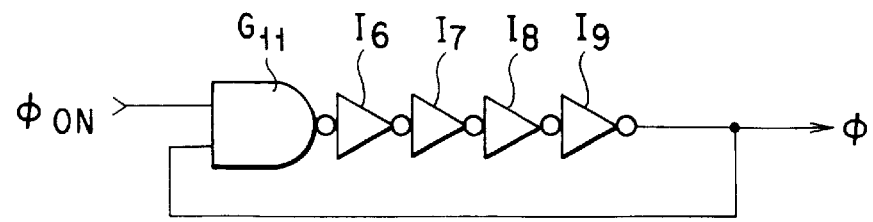
FIG. 15 is a view showing a part of a drive pulse generating circuit of the seventh embodiment of the present invention.

The drive pulses φon and φ are used to drive the voltage multiplier circuit. As shown in FIG. 15, the drive pulse φon is an input signal of a ring oscillator comprising a NAND gate G11 and an inverter I (I6 to I9), and the drive pulse φ is an output signal of the ring oscillator.

In the above-mentioned structure, if the drive pulse φon is changed from low to high, oscillation is started, and the drive pulse φon is fixed to be high during the drive of the voltage multiplier circuit. After changing the drive pulse φon from low to high, nMOS transistors Qn8 to Qn11 are turned on and Qn5 to Qn7 are turned off until time τ1 is passed. Due to this, four multiplier capacitors QD1 to QD4, which comprise D type nMOS transistor, are driven in parallel to the output, respectively.

Thereafter, charge transfer gates Qn5, Qn7, Qn8, Qn10 are turned on, and Qn6, Qn9, and Qn11 are turned off until time τ1 is passed. Due to this, the capacitors QD1, QD2 and the capacitors QD3, QD4 respectively constitute the multiplier cell, and the voltage multiplier circuit is driven in a state that these multiplier cell groups are arranged in parallel. More specifically, after transferring the charge of the capacitor QD1 to QD2, the charge of QD2 is supplied to the output terminal, so that the first and second multiplier cells are connected in series. Similarly, after transferring the charge of the capacitor QD3 to QD4, the charge of QD4 is supplied to the output terminal, so that the third and fourth multiplier cells are connected in series.

Moreover, after passing time τ1+τ2, the capacitors QD1 to QD4 are connected in series to the output. In this case, the charge of each of the capacitors QD1 to QD3 is sequentially transferred. Thereafter, the charge of QD4 is supplied to the output terminal, so that the first to fourth multiplier cells are connected in series. In this case, time τ1 and time τ2 are set in advance.

Table 1 shows phases of drive pulses φ applied to the capacitors QD1 to QD4. The drive pulses φ are all applied to QD1 to QD4 by the same phase up to time τ1. Due to this, the capacitors QD1 to QD4 are operated in parallel. When time t is from τ1 to τ1+τ2, the drive pulses to be applied to QD2 and QD3 are /φ which is negative phases of φ. Due to this, QD1 and QD2, and QD3 and QD4 are operated in series, respectively. When time t exceeds τ1+τ2, negative phase /φ, positive phase φ, negative phase /φ, and positive phase φ are sequentially applied to the capacitors QD1 to QD4, and QD1 to QD4 are operated in series. According to this embodiment, since the connection state of the multiplier cells can be switched by the variable clock, the same technical advantage as the first embodiment can be obtained. The above explained the case of the voltage multiplier circuit, which is formed of four multiplier cells. However, the present invention is not limited to such a case. It is of course that the present invention can be applied to the voltage multiplier circuit, which is formed of an arbitrary number of multiplier cells.

TABLE 1

| Passing time from start of voltage multiplying | Drive Pulse | | | |
| --- | --- | --- | --- | --- |
| | QD1 | QD2 | QD3 | QD4 |
| 0 ≦ t < τ1 | φ | φ | φ | φ |
| τ1 ≦ t < τ1 + τ2 | φ | /φ | /φ | φ |
| τ1 + τ2 ≦ t | /φ | φ | /φ | φ |

Eighth Embodiment

Figure 16:
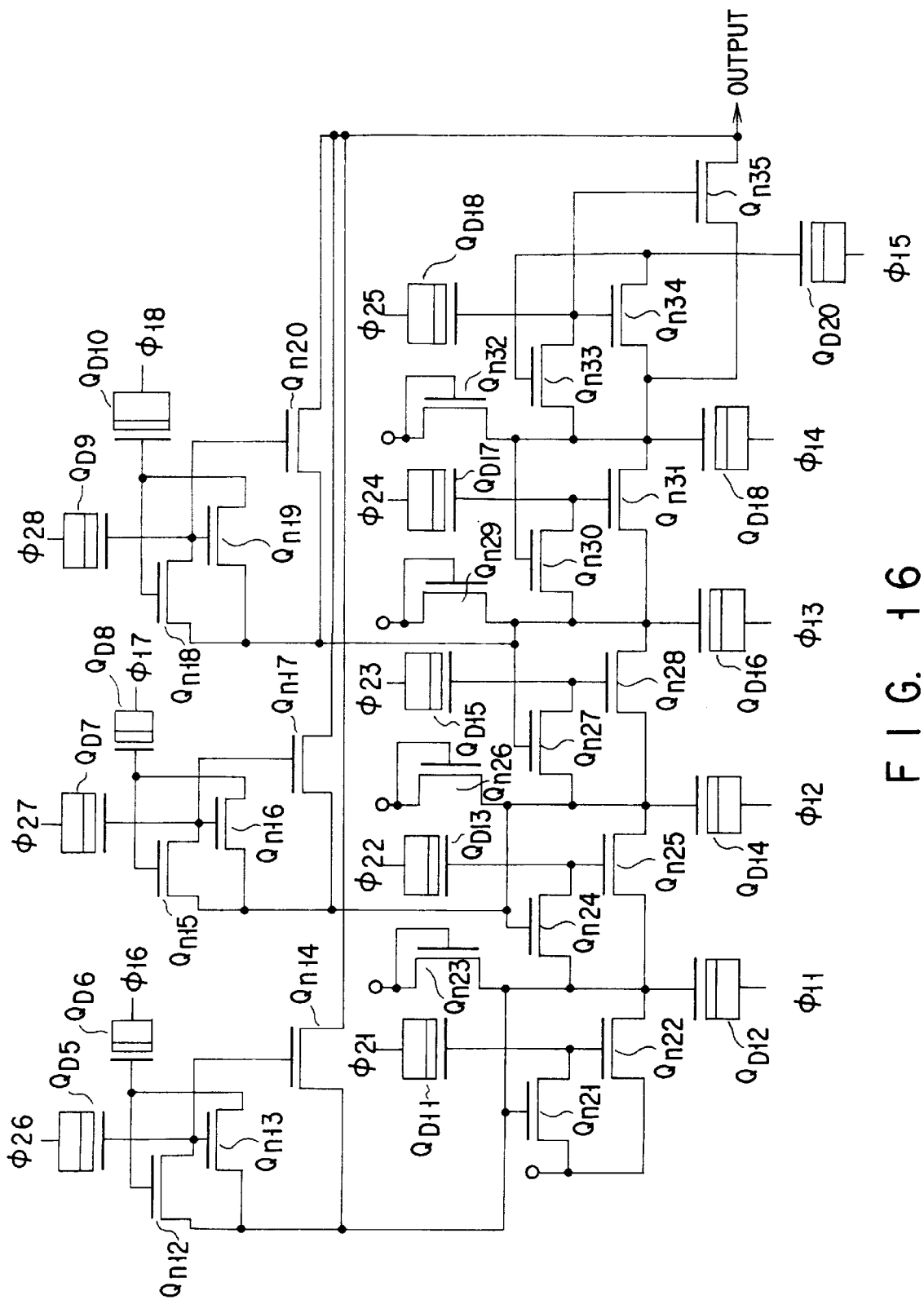
FIG. 16 is a circuit structural view showing the specific structure of a voltage multiplier circuit of the eighth embodiment of the present invention.

FIG. 16 is a circuit structural view showing the specific structure of a voltage multiplier circuit of an eighth embodiment of the present invention. Each multiplier cell is equal to the multiplier cells shown in FIG. 2B. QD(QD5 to QD20) shows a capacitor, and Q$n$ (Qn12 to Qn35) shows an nMOS transistor. Particularly, this embodiment is characterized in that QD5 to QD10 and Qn12 to Qn20 are added as number of stages capacity varying means. The basic principle of this type of the voltage multiplier circuit is disclosed in the document (ISSCC 89 SESSION 10 THAM 10.3 pp 132–133).

As shown in FIG. 17A, the drive pulses φ11 to φ14 are provided as an output of a logic circuit comprising NAND gates G (G12 to G21), inverters I (I10 to I14) and a delay circuit D2. As shown FIG. 17B, the drive pulses φ21 to φ25 are provided as an output of a logic circuit comprising NAND gates G (G22 to G29), inverters I (I15 to I21) and a delay circuit D3.

As shown in FIG. 18A, the drive pulses φ16 to φ18 are provided as an output of a logic circuit comprising NAND gates G (G30 to G33), inverters I (I22 to I24) and a delay circuit D4. As shown in FIG. 18B, the drive pulses φ26 to φ28 are provided as an output of a logic circuit comprising NAND gates G (G34 to G37), inverters I (I25 to I27) and a delay circuit D5.

Figure 19A:
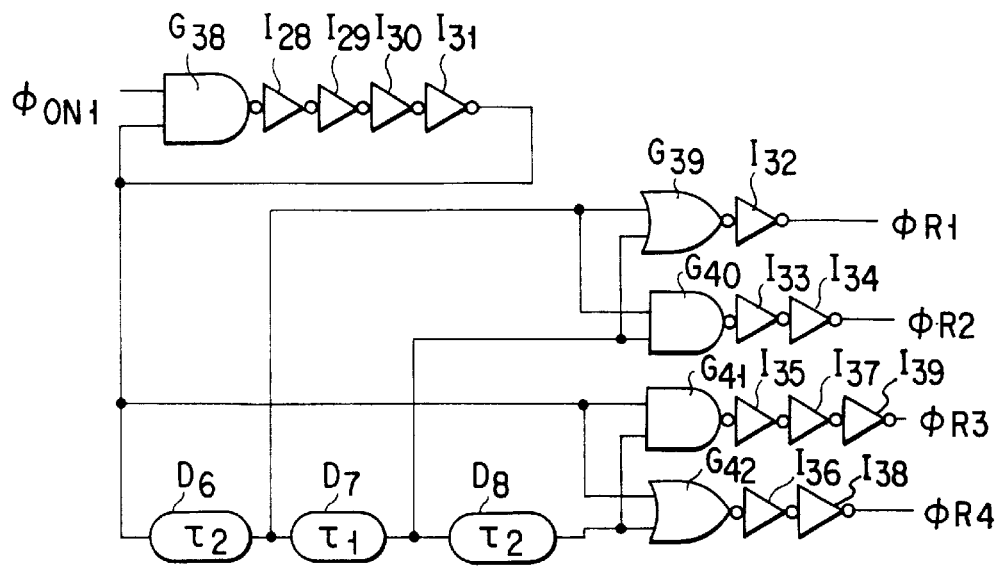
FIGS. 19A and 19B are views showing a drive pulse generating circuit of the eighth embodiment of the present invention.
Figure 19B:
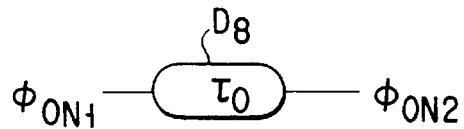

Also, as shown in FIG. 19A, drive pulses φR1 to φR4 to be inputted to these circuits are supplied from an output of a ring oscillator comprising NAND gates G (G38, G40, G41), NOR gates G (G39, G42), inverters I (I28 to I37) and a delay circuit D (D6 to DB). Moreover, a drive pulse φon2 is generated through the delay circuit D8 as shown in FIG. 19B.

Figure 20:
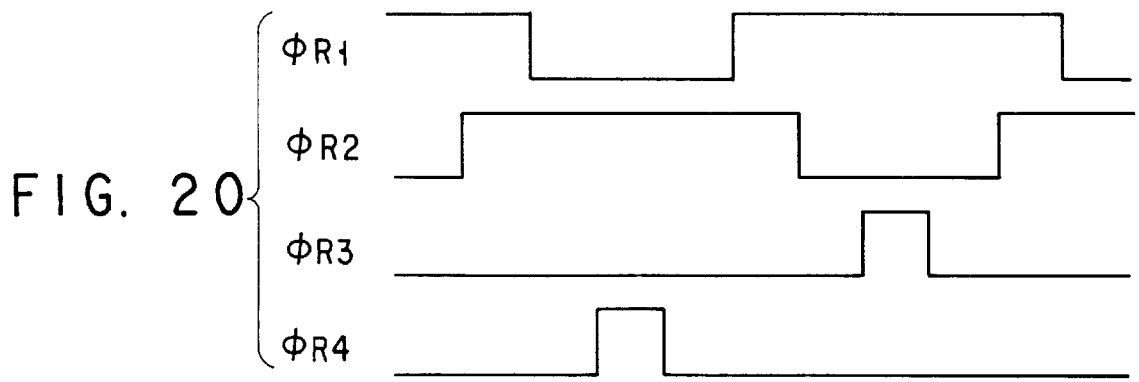
FIG. 20 is a view showing a waveform of a drive pulse generating circuit of the eighth embodiment of the present invention.
Figure 23A:
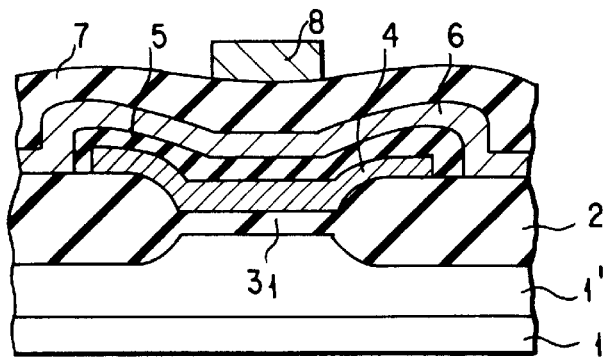
FIGS. 23A and 23B are sectional views of a EEPROM NAND cell.
Figure 23B:
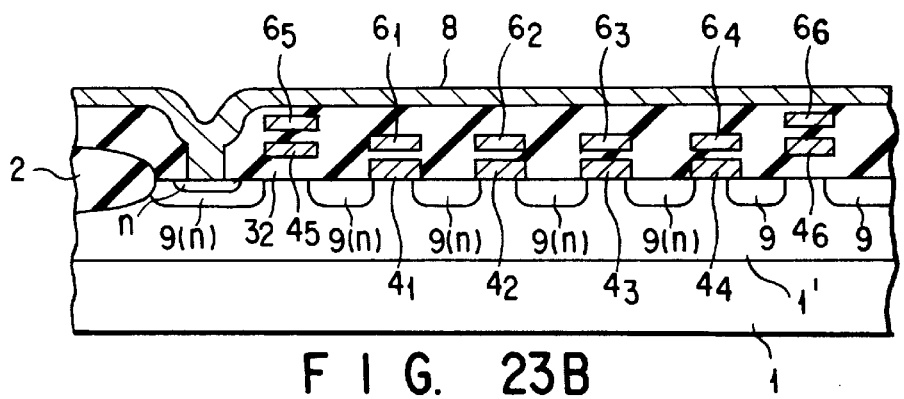
Figure 24:
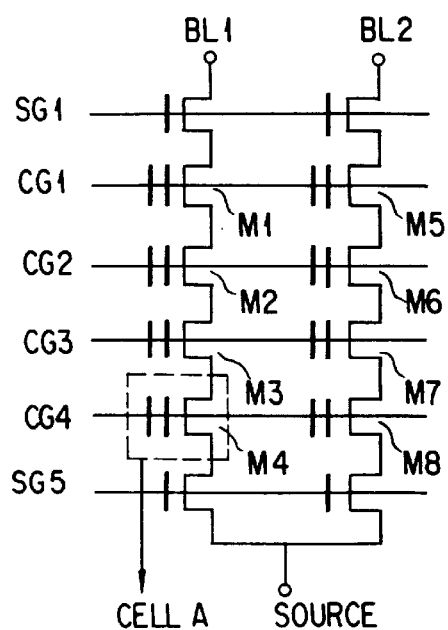
FIG. 24 is a connection diagram of a EEPROM NAND cell.

Then, these drive pulses φ11 to φ18 and φ21 to φ28 can be expressed as shown in Table 2 by use of outputs φR1 to φR4 of the ring oscillator having waveform shown in FIG. 20.

In Table 2, t shows time measured from drive starting time of the voltage multiplier circuit. A mark "L" in Table 2 shows low level. Therefore, from the drive starting of the voltage multiplier circuit (φon1 is changed from low to high) till time τ0 is passed, four capacitors QD12, QD14, QD16, and QD18 are connected in parallel to the output, respectively. Thereafter, the capacitors QD12 and QD14 and the capacitors QD16 and QD18 constitute the multiplier cell groups, respectively till time τ0+τ is passed. Then, the voltage multiplier circuit is driven in a state that these multiplier cell groups are arranged in parallel. Furthermore, thereafter, these four capacitors are driven in series to the output.

According to the above embodiment, the connection state of the multiplier cells can be changed by the variable clock, so that the same advantage as the first embodiment can be obtained. In this case, the number of multiplier cells is not limited. It is of course that this can be applied to the voltage multiplier circuit comprising an arbitrary number of multiplier cells.

TABLE 2

| | | Time | | |
|---|---|---|---|---|
| | | $0 \leq t < \tau 0$ | $\tau 0 \leq t < \tau 0 + \tau$ | $\tau 0 + \tau \leq t$ |
| Drive pulse | φ11 | φR1 | φR1 | φR2 |
| | φ12 | φR1 | φR2 | φR1 |
| | φ13 | φR1 | φR2 | φR2 |
| | φ14 | φR1 | φR1 | φR1 |
| | φ15 | φR2 | φR2 | φR2 |
| | φ16 | φR2 | L | L |
| | φ17 | φR2 | φR1 | L |
| | φ18 | φR2 | L | L |
| | φ21 | φR4 | φR4 | φR3 |
| | φ22 | L | φR3 | φR4 |
| | φ23 | L | L | φR3 |
| | φ24 | L | φR4 | φR4 |
| | φ25 | φR3 | φR3 | φR3 |
| | φ26 | φR3 | L | L |
| | φ27 | φR3 | φR4 | L |
| | φ28 | φR3 | L | L |

The voltage multiplier circuits described in the above embodiments 1 to 8 can be used in place of the voltage multiplier circuit, which is used in the NAND type nonvolatile memory shown in, for example, FIG. 21 which is shown in Japanese Patent Application KOKAI Publication No. 1-173654.

An NAND typed nonvolatile memory is an EEPROM in which a plurality of memory cells are connected in series. The structure and principle of the NAND typed nonvolatile memory will be explained with reference to FIGS. 22, 23A, 23B and 24.

One memory cell has an FETMOS structure in which a floating gate and a control gate are layered on a semiconductor substrate through an insulation film, and constitutes an NAND cell by connecting a plurality of memory cells, which are adjacent to other, in series in a state that a source and a drain are used in common. Such NAND cells are arranged in a matrix manner, thereby forming a memory cell array. The drain of one end side of the NAND cells arranged in a column direction of the cell array is connected in common to a bit line through a selective gate. The source of the other end side is connected to a common source line trough the selective gate. The control gate of the memory cell array and a gate electrode of the selective gate are connected in common in a row direction of the memory cell array as a control gate line (word line) and a selective gate line, respectively.

An operation of the NAND cell type EEPROM is as follows:

A data writing is performed from the memory cell far from the bit line in order. A case of an n channel will be explained as follows:

A high voltage Vpp (for example, 20 V) is applied to the control gate of the selected memory cell, thereby an intermediate potential VM (for example, 10 V) is applied to the control gate of the non-selected memory cell, provided at the bit line side, and the selective gate. 0 V is applied to the bit line in accordance with data (for example, "1"). Also, the intermediate voltage VM is applied to the bit line in accordance with data (for example, "0"). At this time, the voltage of the bit line is sent to the drain of the selected memory through the selective gate and the non-selected gate.

When there is data to be written (data is "1"), a high electric field is applied between the gate and drain of the selected memory cell, and an electron is tunnel-implanted to the floating gate from the substrate. Thereby, a threshold voltage of the selected memory cell is moved in a positive direction. When there is no data to be written (data is "0"), there is no change of the threshold value.

For erasing data, a high voltage is applied to a p type substrate (an n type substrate and a p type well formed thereon in the case of a well structure), the control gate of the selected memory cell and the selective gate are set to 0 V, and a high voltage is applied to the control gate of the non-selected memory cell. Thereby, in the selected memory cell, the electron of the floating gate is emitted to the substrate, and the threshold value is moved in a negative direction.

For reading data, the non-selected memory cell of the bit line side and the selective gate is turned on, and 0 V is applied to the gate of the selected memory cell. At this time, a current flowing to the bit line is read, thereby discriminating data "0" or "1."

Also, the present invention is not limited to the NAND type nonvolatile memory. The present invention may be applied to a NOR type nonvolatile memory. In other words, the present invention may be applied to the semiconductor device having the voltage multiplier circuit. In addition, various modifications can be worked in the range of the claims without deviating from the gist of the present invention.

As mentioned above, according to the present invention, the number of the parallel connections of the multiplier cell groups and the number of the multiplier cells of the multiplier cell groups can be varied. Therefore, there can be realized a voltage multiplier circuit, which can improve charge transfer efficiency for the period of time when the output voltage is low by connecting a large amount of multiplier cells in parallel to the output particularly for the period of time when the output voltage is low. Also, according to the present invention, there can be realized a non-volatile semiconductor memory device having such a voltage multiplier circuit.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A voltage multiplier circuit comprising:
   a plurality of multiplier cell groups, each multiplier cell group comprising a plurality of multiplier cells connected in series, each of said multiplier cells raising an input voltage to output a multiplied voltage, said multiplier cell groups connected in parallel to an output; and a connection switching circuit for switching a connection state of said multiplier cell groups and said multiplier cells, and said switching circuit chancing the number of multiplier cell groups of said voltage multiplier circuit and the number of multiplier cells of the multiplier cell groups.

2. The voltage multiplier circuit according to claim 1, further comprising:

a signal circuit for outputting a predetermined signal; and said connection switching circuit including switching means for connecting outputs of said plurality of multiplier cell groups to each other or the outputs of said multiplier cell groups to the inputs thereof, said switching means having a control gate to which said predetermined signal is inputted for turning on/off said switching means.

3. The voltage multiplier circuit according to claim 2, wherein said switching means is a transistor switch having said control gate.

4. The voltage multiplier circuit according to claim 2, wherein the control gate of said switching means is connected to an output terminal of a boosting circuit, an input terminal of said boosting circuit is connected to an output of said multiplier cell, and said boosting circuit is controlled by said predetermined signal.

5. The voltage multiplier circuit according to claim 2, wherein said connection switching circuit changes the number of the multiplier cells of the multiplier cell groups and the number of the multiplier cell groups for a period of time when the voltage multiplier circuit is driven.

6. The voltage multiplier circuit according to claim 2, wherein said connection switching circuit increases the number of the multiplier cells connected in series in the multiplier cell groups in accordance with the rise of the output voltage, and decreases the number of the multiplier cell groups connected in parallel in said voltage multiplier circuit at the same time.

7. The voltage multiplier circuit according to claim 2, wherein said connection switching circuit is provided such that when the number of the multiplier cell groups is N, the number of the multiplier cells of i ($1 \leq i \leq N$) multiplier cell group is Mi, N is reduced in order that the total obtained by integrating Mi by i is constant in accordance with the rise of the output voltage.

8. The voltage multiplier circuit according to claim 1, wherein a connection switching signal of said connection switching circuit is provided for a predetermined period of time.

9. The voltage multiplier circuit according to claim 2, wherein a connection switching signal of said connection switching circuit is provided for a predetermined period of time.

10. The voltage multiplier circuit according to claim 1, wherein a connection switching signal of said connection switching circuit is provided on an external command.

11. The voltage multiplier circuit according to claim 2, wherein a connection switching signal of said connection switching circuit is provided on an external command.

12. The voltage multiplier circuit according to claim 1, wherein a connection switching signal of said connection switching circuit is provided by detecting an output voltage of the voltage multiplier circuit and comparing the detected output voltage with a predetermined reference voltage.

13. A nonvolatile semiconductor memory device having a voltage multiplier circuit, said voltage multiplier circuit comprising:

a plurality of multiplier cells for raising an input voltage to output a multiplied voltage, said plurality of multiplier cells divided into multiplier cell groups, said multiplier cell groups connected in parallel or series to an output and having one or a plurality of the multiplier cells connected in series; and a connection switching circuit for switching a connection state of said multiplier cells, and said switching circuit changing the number of multiplier cells of the multiplier cell groups and the number of multiplier cell groups.

14. A nonvolatile semiconductor memory device having a voltage multiplier circuit according to claim 1, further comprising:

a signal circuit for outputting a predetermined signal; and said connection switching circuit including switching means for connecting outputs of said plurality of multiplier cell groups to each other or the outputs of said multiplier cell groups to the inputs thereof, said switching means having a control gate to which said predetermined signal is inputted for turning on/off said switching means.

15. A voltage multiplier circuit comprising:

a plurality of multiplier cells for raising an input voltage to output a multiplied voltage, each of said plurality of multiplier cells comprising a capacitor for multiplication and a charge transfer gate, said plurality of multiplier cells connected in series to an output, and driven by a plurality of pulse voltages whose phases are set to transfer electrical charges in a direction of said output;

a plurality of parallel connecting means for directly outputting electrical charges of each of said multiplier cell to the output; and a number of stages and capacity varying means for varying the number of said multiplier cells in which electrical charges are outputted in series and the number of said multiplier cells in which electrical charges are directly outputted to the output.

16. The voltage multiplier circuit according to claim 15, wherein said number of stages and capacity varying means is provided such that for a period of time when the output voltage is relatively low, the number of the multiplier capacitors connected in parallel is increased and the number of the multiplier cells connected in series to the output is reduced, and in accordance with the rise of the output voltage, the number of multiplier capacitors connected in parallel is reduced and the number of the multiplier cells connected in series to the output is increased.

17. The voltage multiplier circuit according to claim 16, wherein said number of stages and capacity varying means varies a phase of a pulse voltage to be applied to said voltage multiplier capacitor, and said parallel connecting means connects said voltage multiplier capacitor to the output through a diode or a transistor of diode connection.

18. The voltage multiplier circuit according to claim 16, wherein a change by said number of stages and capacity varying means is executed for a predetermined period of time.

19. The voltage multiplier circuit according to claim 16, wherein a change by said number of stages and capacity varying means is executed on an external command.

20. The voltage multiplier circuit according to claim 16, wherein a change by said number of stages and capacity varying means is executed on detecting an output voltage of the voltage multiplier circuit and comparing the detected output voltage with a predetermined reference voltage.

21. A voltage multiplier circuit comprising:

at least first, second and third multiplier cell groups, each of said multiplier cell groups comprising a plurality of multiplier cells for raising an input voltage to a multiplied voltage;

said first multiplier cell group comprising a plurality of multiplier cells connected in parallel to an output;

said second multiplier cell group comprising plural series-connected multiplier cells, said plural series-connected multiplier cells connected in parallel to an output;

said third multiplier cell group comprising a plurality of multiplier cells being connected in series to an output; and a connection switching circuit for switching a connection state of said plurality of multiplier cell groups, thereby selecting one of said first, second and third cell groups for raising of the input voltage.

22. The voltage multiplier circuit according to claim 21, wherein said connection switching circuit switches a connection state of said first multiplier cell group to that of said third multiplier cell group through that of said second multiplier cell group so as to raise an input voltage to a multiplied voltage.

23. The voltage multiplier circuit according to claim 21, wherein said connection switching circuit employs at least one of different connections comprising first a connection of said first multiplier cell group to said second multiplier cell group, a second connection of said first multiplier cell group to said third multiplier cell group, and a third connection in which a plurality of said multiplier cell groups of said voltage multiplier circuit and a plurality of said multiplier cells of said multiplier cell groups are modified.

24. The voltage multiplier circuit according to claim 21, wherein said connection switching circuit comprises switching means having a control gate and means for applying a switching signal to said control gate.

25. The voltage multiplier circuit according to claim 24, wherein said switching means is a transistor switch having said control gate.

26. The voltage multiplier circuit according to claim 24, wherein the means for applying the switching signal comprises a connection to an output terminal of a boosting circuit, said voltage multiplier circuit further including said boosting circuit, an input terminal of said boosting circuit being connected to an output of said multiplier cell, and said boosting circuit being controlled by said switching signal.

27. The voltage multiplier circuit according to claim 23, wherein said connection switching circuit increases said plurality of multiplier cells connected in series in said multiplier cell groups in accordance with a selected rise of an output voltage, and decreases said plurality of the multiplier cells connected in parallel in said multiplier cell groups at the same time.

28. The voltage multiplier circuit according to claim 22, wherein said connection switching circuit is provided such that when a number of multiplier cells connected in series within plural series-connected multiplier cells is p and a number of plural series-connected multiplier cells is q, q is reduced in order that the total obtained by multiplying p by q is held constant in accordance with a selected rise of an output voltage.

29. The voltage multiplier circuit according to claim 22, wherein said connection switching circuit provides a connection switching signal for a predetermined period of time.

30. The voltage multiplier circuit according to claim 22, wherein said switching connection circuit provides a connection switching signal by detecting an output voltage of the voltage multiplier circuit and comparing the detected output voltage with a predetermined reference voltage.

31. The voltage multiplier circuit according to claim 22, wherein said connection switching circuit comprises means for providing a connection switching signal on an external command.

32. A voltage multiplier circuit comprising:

a plurality of multiplier cells, each multiplier cell raising an input voltage to output a multiplied voltage, a plurality of said multiplier cells connected in series to an output terminal; and a connection switching circuit for changing a number of said plurality of multiplier cells connected in series to said output terminal.

33. The voltage multiplier circuit according to claim 32, wherein said connection switching circuit comprises switching means having a control gate, and means for applying a switching signal for turning on/off said switching means.

34. The voltage multiplier circuit according to claim 33, wherein said switching means comprises a transistor switch having said control gate.

35. The voltage multiplier circuit according to claim 33, further comprising a boosting circuit having an output terminal connected to the control gate of said switching means, an input terminal of said boosting circuit being corrected to an output of one said multiplier cell, and said boosting circuit being controlled by said switching signal.

36. The voltage multiplier circuit according to claim 33, wherein said connection switching circuit increases a number of multiplier cells connected in series in said plurality of multiplier cells connected in series.

37. The voltage multiplier circuit according to claim 33, wherein said connection switching circuit provides a connection switching signal for a predetermined period of time.

38. The voltage multiplier circuit according to claim 33, wherein said switching connection circuit comprises means for providing a connection switching signal by detecting an output voltage of the voltage multiplier circuit and comparing the detected output voltage with a predetermined reference voltage.

39. The voltage multiplier circuit according to claim 33, wherein said connection switching circuit comprises means for providing a connection switching signal on an external command.

40. A voltage multiplier circuit comprising:

a plurality of multiplier cells, each multiplier cell raising an input voltage to output a multiplied voltage; and a connection switching circuit for changing a connection state of said plurality of multiplier cells.

41. The voltage multiplier circuit according to claim 40, wherein said connection switching circuit comprises switching means having a control gate, and means for applying a switching signal to said control gate for turning on/off said switching means.

42. The voltage multiplier circuit according to claim 41, wherein said switching means is a transistor switch having said control gate.

43. A voltage multiplier circuit comprising:

a plurality of multiplier cells, each multiplier cell raising an input voltage to output a multiplied voltage; and a connection switching circuit for switching a connection state of said plurality of multiplier cells, wherein said connection switching circuit comprises switching means having a control gate, and means for applying a switching signal to said control gate for turning on/off said switching means, wherein the means for applying a switching signal comprises a boosting circuit, an input terminal of said boosting circuit being connected to an output of one said multiplier cell, and said boosting circuit including a logic circuit controlled by said switching signal.

44. The voltage multiplier circuit according to claim 41, wherein said connection switching circuit provides a variable plurality of multiplier cells connected in series in said plurality of multiplier cells.

45. The voltage multiplier circuit according to claim 41, wherein said switching signal of said connection switching circuit is provided for a predetermined period of time.

46. The voltage multiplier circuit according to claim 41, wherein said switching signal of said switching connection circuit is provided by detecting an output voltage of the voltage multiplier circuit and comparing the detected output voltage with a predetermined reference voltage.

47. The voltage multiplier circuit according to claim 41, wherein said switching signal of said connection switching circuit is provided on an external command.

\* \* \* \* \*

UNITED STATES PATENT AND TRADEMARK OFFICE
CERTIFICATE OF CORRECTION

PATENT NO.: 5,969,988

DATED: October 19, 1999

INVENTORS: Toru TANZAWA et al.

It is certified that an error appears in the above-identified patent and that said Letters Patent is hereby corrected as shown below:

On the Title Page, Item [54], in the Title, line 4, after "MULTIPLIER", insert --CIRCUIT--.

Claim 1, Column 15, line 3, "chancing" should read --changing--.

Signed and Sealed this

Third Day of April, 2001

*Attest:*

NICHOLAS P. GODICI

*Attesting Officer*    *Acting Director of the United States Patent and Trademark Office*